(12) United States Patent
Wang et al.

(10) Patent No.: US 11,023,053 B2
(45) Date of Patent: Jun. 1, 2021

(54) INNER-SENSOR POINTING DEVICE SYSTEM

(71) Applicants: CONTOUR INNOVATIONS LLC, Wilmington, DE (US); HanNing Lu, Guangzhou (CN)

(72) Inventors: Steven Wang, Windham, NH (US); HanNing Lu, Guangzhou (CN); ChengCai Tan, Guangzhou (CN); Changjun Zhao, Henan (CN); Marco Vito Maria Laurenzano, Asker (NO)

(73) Assignee: CONTOUR INNOVATIONS LLC, Wilmington, DE (US)

( * ) Notice: Subject to any disclaimer, the term of this patent is extended or adjusted under 35 U.S.C. 154(b) by 0 days.

(21) Appl. No.: 16/348,953

(22) PCT Filed: Nov. 11, 2016

(86) PCT No.: PCT/CN2016/105497
§ 371 (c)(1),
(2) Date: May 10, 2019

(87) PCT Pub. No.: WO2018/086070
PCT Pub. Date: May 17, 2018

(65) Prior Publication Data
US 2020/0167008 A1    May 28, 2020

(51) Int. Cl.
*G06F 3/03*     (2006.01)
*G06F 3/0338*  (2013.01)
(Continued)

(52) U.S. Cl.
CPC ........... *G06F 3/0317* (2013.01); *G01R 33/07* (2013.01); *H03K 17/97* (2013.01); *G06F 3/0338* (2013.01)

(58) Field of Classification Search
CPC .... G06F 3/0317; G06F 3/0338; G06F 3/0362; G06F 3/033; G01R 33/07; H03K 17/97
See application file for complete search history.

(56) References Cited

U.S. PATENT DOCUMENTS

| 4,543,571 A | 9/1985 | Bilbrey et al. |
| 4,544,915 A | 10/1985 | Aherne et al. |
(Continued)

FOREIGN PATENT DOCUMENTS

| CN | 102144197 A | 8/2011 |
| CN | 202110495 U | 1/2012 |
(Continued)

OTHER PUBLICATIONS

Berger, Jennifer, "Rolling Away From Pain," Macworld, vol. 20, No. 9, Jun. 2003, 5 pages.
(Continued)

*Primary Examiner* — Brent D Castiaux
(74) *Attorney, Agent, or Firm* — Lando & Anastasi, LLP

(57) ABSTRACT

Aspects discussed herein are directed to ergonomic pointing device systems. In one example, a pointing device system includes an elongate base member, a sleeve disposed to fit over at least a portion of the elongate base member, the sleeve configured to rotate about the elongate base member in a first direction and slide about the elongate base member in a second direction substantially orthogonal to the first direction, where the sleeve includes a pattern on a surface thereof, and a sensor disposed within the elongate base member and positioned to detect at least one of a rotational movement of the sleeve relative to the sensor and an axial movement of the sleeve relative to the sensor based at least in part on a variation of the pattern within a field of view of the sensor.

75 Claims, 22 Drawing Sheets

(51) Int. Cl.
*G01R 33/07* (2006.01)
*H03K 17/97* (2006.01)

(56) References Cited

U.S. PATENT DOCUMENTS

| | | | |
|---|---|---|---|
| 4,692,756 A | 9/1987 | Clark | |
| 4,712,101 A | 12/1987 | Culver | |
| 4,724,715 A | 2/1988 | Culver | |
| 4,799,049 A | 1/1989 | Avila | |
| 4,928,093 A | 5/1990 | Rahman | |
| 4,982,618 A | 1/1991 | Culver | |
| 5,115,231 A | 5/1992 | Avila et al. | |
| 5,126,723 A | 6/1992 | Long et al. | |
| 5,164,712 A | 11/1992 | Niitsuma | |
| 5,222,136 A | 6/1993 | Rasmussen et al. | |
| 5,231,380 A | 7/1993 | Logan | |
| 5,600,348 A | 2/1997 | Bartholow et al. | |
| 5,635,926 A | 6/1997 | Li | |
| 5,666,138 A | 9/1997 | Culver | |
| 5,703,356 A | 12/1997 | Bidiville et al. | |
| 5,704,037 A | 12/1997 | Chen | |
| 5,818,427 A | 10/1998 | Stromberg | |
| 6,018,334 A | 1/2000 | Eckerberg et al. | |
| 6,020,877 A | 2/2000 | Smith | |
| 6,040,977 A | 3/2000 | Hoffer | |
| 6,046,728 A | 4/2000 | Hume et al. | |
| 6,084,574 A | 7/2000 | Bidiville | |
| 6,091,401 A | 7/2000 | Chen et al. | |
| 6,172,665 B1 | 1/2001 | Bullister | |
| 6,208,133 B1 | 3/2001 | Ehling et al. | |
| 6,300,938 B1 * | 10/2001 | Culver | G06F 3/0362 345/156 |
| 6,337,680 B1 | 1/2002 | Hamaji | |
| 6,380,927 B1 | 4/2002 | Ostrum et al. | |
| 7,199,792 B2 | 4/2007 | Wang | |
| 7,215,320 B2 | 5/2007 | Takeuchi et al. | |
| 7,973,767 B2 | 7/2011 | Pedrazzini et al. | |
| 8,363,019 B2 | 1/2013 | Cho et al. | |
| 8,830,166 B2 | 9/2014 | Nien et al. | |
| 9,013,426 B2 | 4/2015 | Cole et al. | |
| 9,024,873 B2 | 5/2015 | Nien et al. | |
| 9,086,743 B2 | 7/2015 | Wang et al. | |
| 9,092,072 B2 | 7/2015 | Wang et al. | |
| 9,317,123 B2 | 4/2016 | Provancher et al. | |
| 9,430,064 B2 | 8/2016 | Wang et al. | |
| 9,436,299 B2 | 9/2016 | Wang et al. | |
| 9,477,322 B2 | 10/2016 | Noris et al. | |
| 9,489,064 B2 | 11/2016 | Wang et al. | |
| 2001/0019324 A1 | 9/2001 | Rosenberg | |
| 2002/0126025 A1 * | 9/2002 | Wang | G06F 3/0213 341/20 |
| 2007/0097073 A1 | 5/2007 | Takashima et al. | |
| 2007/0113681 A1 | 5/2007 | Nishimura et al. | |
| 2008/0278444 A1 | 11/2008 | Schelling et al. | |
| 2009/0256817 A1 | 10/2009 | Perlin et al. | |
| 2011/0018798 A1 | 1/2011 | Chiang | |
| 2011/0037693 A1 | 2/2011 | Chiang | |
| 2011/0038114 A1 | 2/2011 | Pance et al. | |
| 2011/0134031 A1 * | 6/2011 | Wang | G06F 3/03548 345/157 |
| 2011/0141052 A1 | 6/2011 | Bernstein et al. | |
| 2011/0199306 A1 | 8/2011 | Pan | |
| 2012/0038674 A1 | 2/2012 | Stergiou et al. | |
| 2012/0063114 A1 * | 3/2012 | Pan | G06F 3/0362 361/809 |
| 2012/0162070 A1 * | 6/2012 | Nien | G06F 3/0338 345/157 |
| 2012/0228111 A1 | 9/2012 | Peterson et al. | |
| 2013/0033420 A1 * | 2/2013 | Nien | G06F 3/0354 345/156 |
| 2013/0120264 A1 | 5/2013 | Nien et al. | |
| 2013/0142362 A1 | 6/2013 | Lynn et al. | |
| 2017/0052607 A1 | 2/2017 | Wang et al. | |

FOREIGN PATENT DOCUMENTS

| | | |
|---|---|---|
| CN | 202306462 U | 7/2012 |
| CN | 202394188 U | 8/2012 |
| CN | 202748741 U | 2/2013 |
| CN | 104240486 A | 12/2014 |
| DK | 201570565 A1 | 8/2015 |
| DK | 201570486 A1 | 11/2016 |
| EP | 0382350 A2 | 8/1990 |
| EP | 0992936 A2 | 4/2000 |
| EP | 2226705 A2 | 9/2010 |
| EP | 2249232 A2 | 11/2010 |
| EP | 2485123 A1 | 8/2012 |
| JP | 2000047812 A | 2/2000 |
| JP | 2000132331 A | 5/2000 |
| JP | 2006023915 A | 1/2006 |
| SE | 1551082 A1 | 9/2015 |
| SE | 1551035 A1 | 12/2016 |
| TW | 200901009 A | 1/2009 |
| TW | M364911 U | 9/2009 |
| TW | M414614 U | 10/2011 |
| TW | M422108 U | 2/2012 |
| TW | 201222347 A | 6/2012 |
| WO | 8706733 A1 | 11/1987 |
| WO | 200206943 A1 | 1/2002 |
| WO | 0243049 A1 | 5/2002 |
| WO | 200243046 A1 | 5/2002 |
| WO | 2002043046 A1 | 5/2002 |
| WO | 03038800 A1 | 5/2003 |
| WO | 2009117052 A1 | 9/2009 |
| WO | 2011070522 A2 | 6/2011 |
| WO | 2012032480 A1 | 3/2012 |
| WO | 2014122191 A1 | 8/2014 |

OTHER PUBLICATIONS

"Ergonomic Equipment Can Take Away the Strain in Everyday Tasks," New York Times, Late Edition (East Coat), Nov. 15, 2001, 2 pages.

"This Ain't No. Palindrome," Call Center Magazine, vol. 16, No. 2, pp. 14-26, Feb. 2003.

"On a Roll," Call Center Magazine, vol. 15, No. 11, Nov. 2002, pp. 10-12.

Shaw, Keith, "Cool Tools: Products That Have Graced the Cool Tool's Lab . . . ," Network World, vol. 9, No. 6, Feb. 11, 2002, p. 30.

Shaw, Keith, "Cool Tools," Network World, vol. 18, No. 46, Nov. 21, 2001, p. 50.

"SPOTLIGHT Best Practices," Professional Safety, vol. 53, No. 7, Jul. 2008, 9 pages.

"Product News," ISHN vol. 43, No. 7, Jul. 2009, p. 43.

Akiba, Internet Site at http://akiba-pc.watchimpress.co.jp/hotline/991127/newitem.html, Nov. 27, 1999.

Firewoiks, NOMUS: All Hail the Mouse King, Internet Site at http://mattstow.com/, Jul. 1, 2008.

PC Mag, Comfort and Support, Internet Site at http://www.pcmag.com/article2/0,2817,1190393,00.asp, Aug. 5, 2003.

Scemosystems, Sun-flex Nomus ergonomic mouse and wrist-rest, USB, Internet Site at http://scemosystems.fi/en/sun-flex-nomus-ergonomic-mouse-and-wrist-rest-usb, as of May 2016.

Technical Data Sheet for part #HDNS-2000, Agilent Technologies, (2000).

Technical Data Sheet for part #HDNS-2100 and HDNS-2100 #001, Agilent Technologies, (Apr. 20, 2001).

Technical Data Sheet for part #HDNS-2200 and HDNS-2200 #001, Agilent Technologies, (2000).

Search Report in Republic of China (Taiwan) Patent Application No. 106138873 dated Apr. 14, 2021.

Office Action in Republic of China (Taiwan) Patent Application No. 106138873 dated Apr. 14, 2021.

* cited by examiner

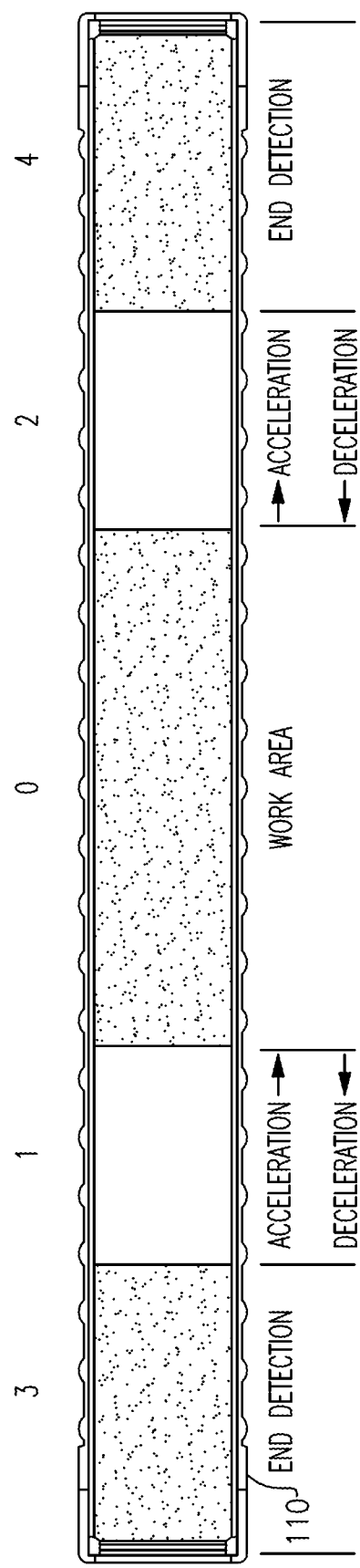

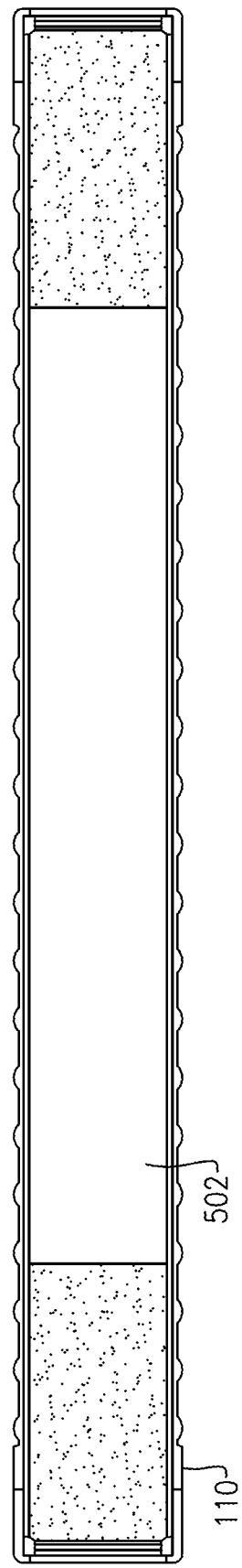

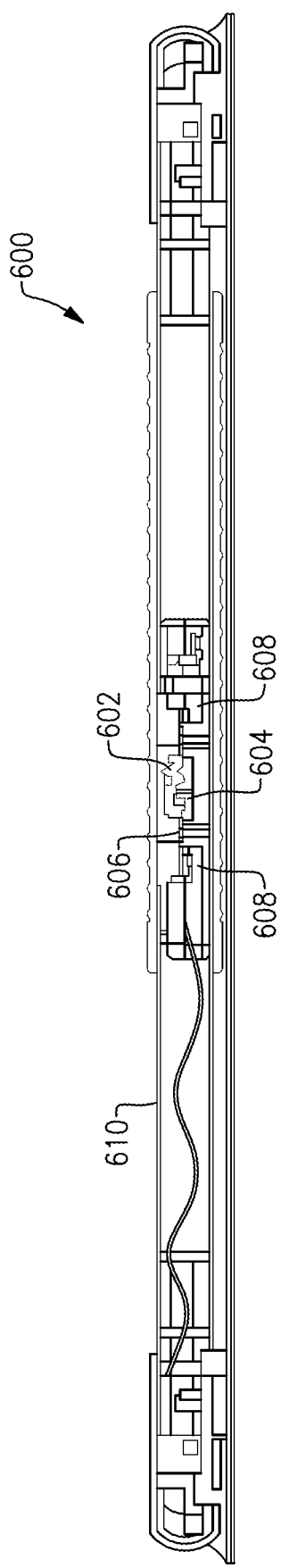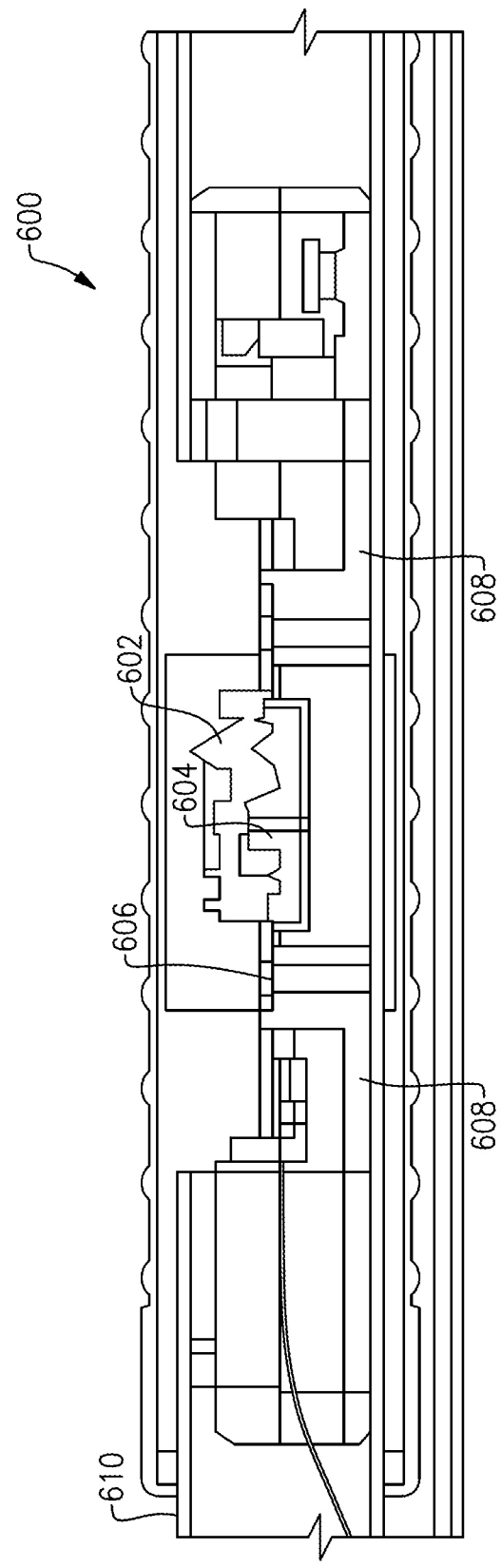

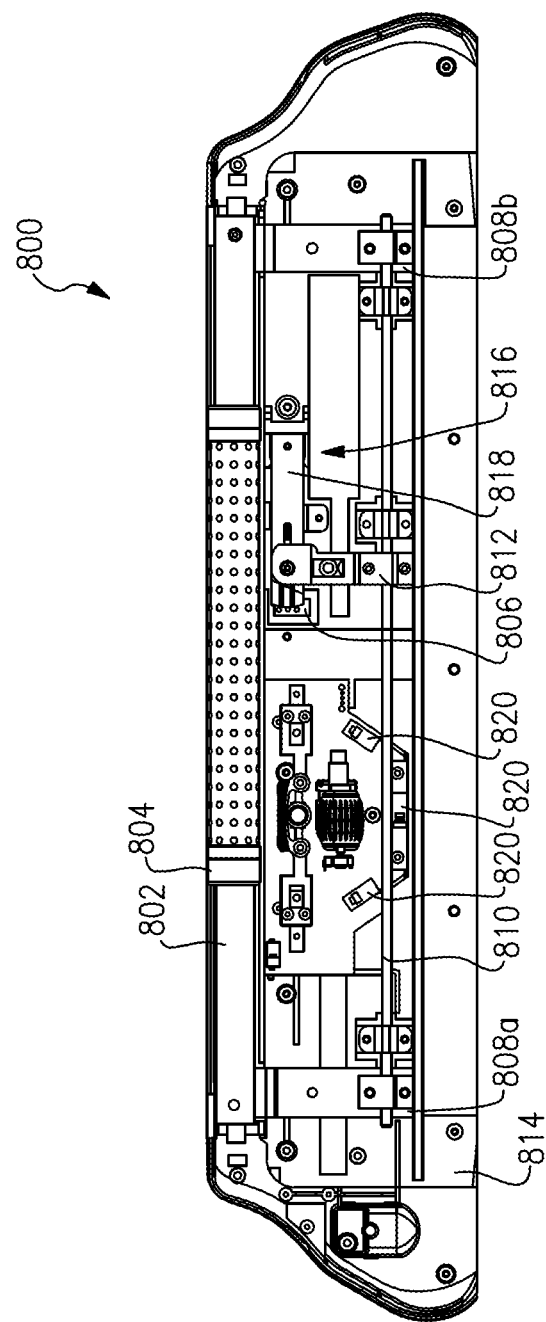

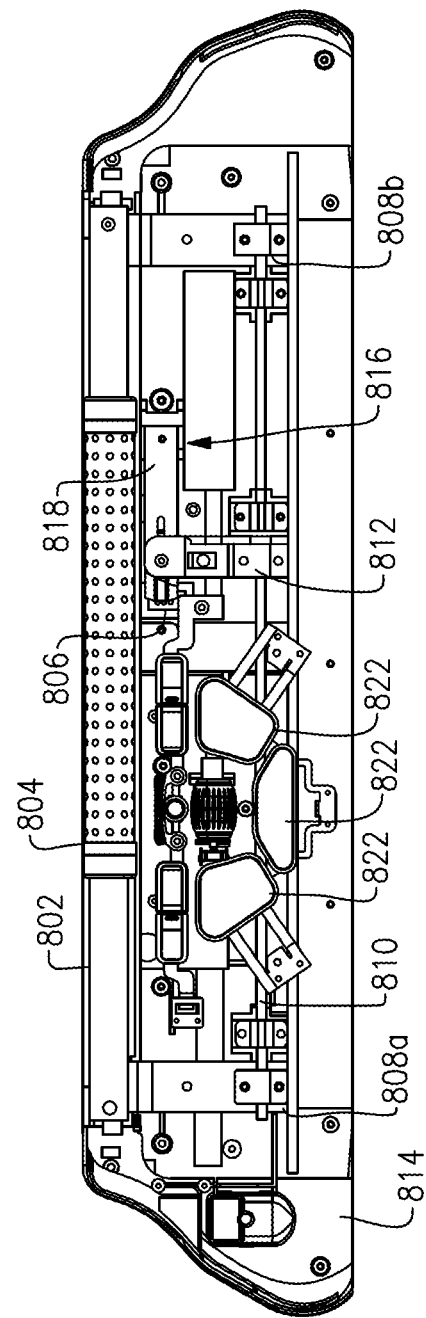

INNER-SENSOR POINTING DEVICE SYSTEM

RELATED APPLICATIONS

This application is a U.S. National Stage Application under 35 U.S.C. § 371 of International Application No. PCT/CN2016/105497, filed Nov. 11, 2016, titled INNER-SENSOR POINTING DEVICE SYSTEMS, which is herein incorporated by reference.

BACKGROUND OF THE DISCLOSURE

In computer systems, a pointing device generally functions by detecting two-dimensional motion relative to its supporting surface. The pointing device may include various user features, such as "wheels" or buttons, which permit a user of the device to perform system-dependent operations. The motion of the pointing device typically translates into the motion of a pointer on a display, which allows for fine control of a Graphical User Interface (GUI). Typical pointing devices utilize a "point and click" sequence of operations where a cursor, once moved to a desired position, performs a click operation responsive to user depression of a button. The computer mouse is one example of such a pointing device. Other known examples can include a trackball, a joystick, or a touchpad.

SUMMARY OF THE DISCLOSURE

Aspects and embodiments discussed herein are directed to a pointing device system that is controllable by a user without requiring unnecessary actions and movements. In particular, various embodiments facilitate the avoidance of harmful movements that may cause injuries or strains to the user. In addition to minimizing strain on the arms, back, shoulders, neck, hands, and wrists of a user, aspects and embodiments of the pointing device systems discussed herein improve the stability, structural integrity, and alignment of typical pointing devices. Moreover, aspects and embodiments discussed herein provide an ergonomic pointing device system design which is less complex and easier to manufacture when compared to other ergonomic pointing device systems. Various other benefits and advantages of the aspects and embodiments discussed herein are further described with reference to FIGS. 1-19.

According to an aspect, provided is a pointing device system. In one example, the pointing device system comprises an elongate base member, a sleeve disposed to fit over a portion of the elongate base member, the sleeve configured to rotate about the elongate base member in a first direction and slide about the elongate base member in a second direction substantially orthogonal to the first direction, wherein the sleeve includes a pattern on an inner surface thereof, and a sensor disposed along a surface of the elongate base member, or within the elongate base member, and positioned to detect at least one of a rotational movement of the sleeve relative to the sensor and an axial movement of the sleeve relative to the sensor based at least in part on a variation of the pattern within a field of view of the sensor.

According to an aspect, provided is pointing device system. In one example, the pointing device system comprises an elongate base member, a sleeve disposed to fit over a portion of the elongate base member, the sleeve configured to rotate about the elongate base member in a first direction and slide about the elongate base member in a second direction substantially orthogonal to the first direction, a click trigger positioned to be activated responsive to an application of a downward pressure to the sleeve or elongate base member, wherein activation of the click trigger generates a click operation, and a Piezoelectric device in communication with the click trigger and configured to generate an audible click responsive to activation of the click trigger.

According to an aspect, provided is a pointing device system. In one example, the pointing device system comprises an elongate base member, a sleeve disposed to fit over a portion of the elongate base member, the sleeve configured to rotate about the elongate base member in a first direction and slide about the elongate base member in a second direction substantially orthogonal to the first direction, a click trigger positioned to activate responsive to an application of downward pressure to the sleeve or elongate base member, wherein activation of the click trigger generates a click operation, a first support bracket disposed at a first end of the elongate base member, a second support bracket disposed at a distal second end of the elongate base member, a support rod interposed between the first support bracket and the second support bracket, wherein the first support bracket and second support bracket are configured to displace the support rod responsive to the application of downward pressure to the sleeve or elongate base member, and a flange coupled to the support rod between the first support bracket and the second support bracket and positioned to apply pressure to the click trigger proportional to the downward pressure to the sleeve.

According to an aspect, provided is a pointing device system. In one example, the pointing device system comprises an elongate base member, a sleeve disposed to fit over a portion of the elongate base member, the sleeve configured to rotate about the elongate base member in a first direction and slide about the elongate base member in a second direction substantially orthogonal to the first direction, a click trigger positioned to be activated responsive to an application of downward pressure to the sleeve, wherein activation of the click trigger generates a click operation, and a click pressure adjuster including a leaf spring and a sliding fulcrum positioned proximate the click trigger and configured to adjust a downward pressure which activates the click trigger.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 4B is an example zone assignment of the pattern illustrated in FIG. 4A, according to aspects of the present disclosure;

FIG. 5A is another example of a pattern that may be applied to the inside surface of a sleeve, according to aspects of the present disclosure;

FIG. 6A is a cross-sectional view of one example of a pointing device system including an inner-sensor, according to aspects of the present disclosure;

FIG. 6B is an enhanced view of the inner-sensor illustrated in FIG. 6A, according to aspects of the present disclosure;

FIG. 8A is another example of a pointing device system according to aspects of the present disclosure;

FIG. 8B is one example of the pointing device system illustrated in FIG. 8A including a plurality of buttons, according to aspects of the present disclosure;

DETAILED DESCRIPTION OF THE DISCLOSURE

Figure 1:
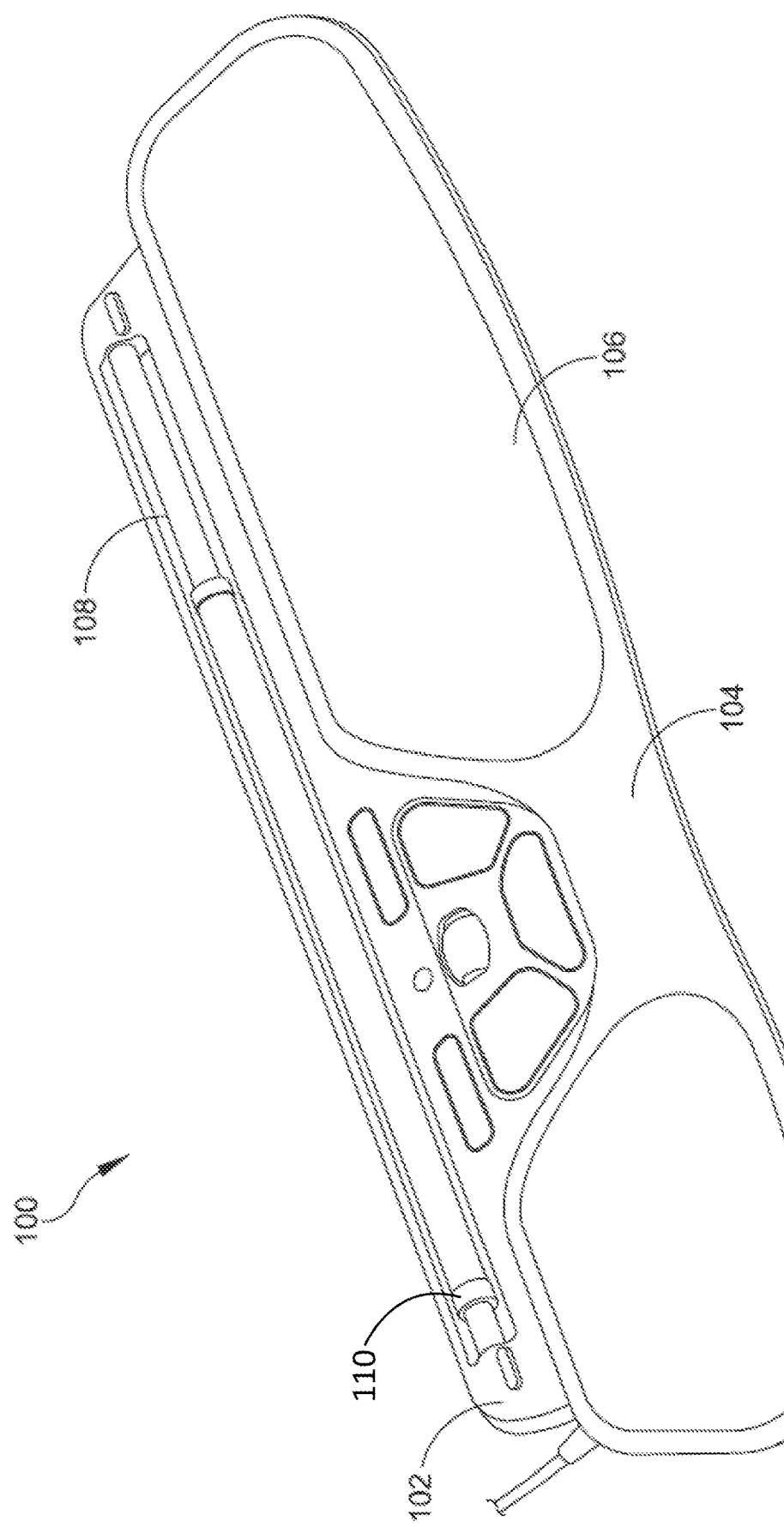
FIG. 1 is an example of a pointing device system according to aspects of the present disclosure.

Aspects and embodiments discussed herein are directed to an improved pointing device system and design. In one example, the pointing device system may include a sleeve which is rotatable and slidable along an elongate base member (also referred to as a "central housing"). The system may include a sensor which is positioned to detect the rotation and/or axial movement of the sleeve, and that is configured to communicate with a processor to effect movement of a pointer within a visual display. Specifically, by rotating the sleeve around a central axis of the elongate base member and sliding it along the central axis, a user of the pointing device system may control the x and y coordinates of a pointer location in a Graphical User Interface (GUI) of a computer system to which the pointing device system is connected. The elongate base member may be depressible by the user, permitting the user to perform actions corresponding to conventional mouse clicks. In various examples, the system may include, either individually or in combination, an improved support assembly, a patterned sleeve, a Piezoelectric device, and/or a click pressure adjuster, each of which improve the functionality of the pointing device system, as well as, the usability.

Conventional pointing devices suffer from a variety of deficiencies, such as ergonomic problems. Often, operation of a conventional pointing device requires an unnecessary amount of open space. Moreover, extended use of certain conventional pointing devices has been known to result in injuries or strains to a user. Accordingly, aspects and embodiments discussed herein reduce the amount of space necessary to operate a pointing device, while also minimizing the strain on the arm, back, shoulders, neck, hands, or wrists, of the user. Various aspects and embodiments of a pointing device discussed herein have therefore been developed as a replacement for a conventional computer mouse.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations and combinations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Turning to FIG. 1, a first example of a pointing device system 100 is shown. In one implementation, the pointing device system 100 can include a device case 102. The device case 102 secures and protects additional parts and components of the pointing device system 100. FIG. 1 illustrates the pointing device system 100 as having a device case 102 including a removable wrist rest 104. The wrist rest 104 may have one or more cushions 106 to improve wrist positioning of a user of the pointing device 100.

In various examples, the pointing device system 100 may include an elongate base member 108 ("base member" or "central housing") and a sleeve 110. The sleeve may be disposed to fit over a portion of the base member 108, which in certain instances may include a hollow tube. As illustrated in the example of FIG. 1, in certain instances the base member 108 may extend coaxially through a center of the sleeve 110 such that the sleeve 110 may rotate about the base member 108 in a first direction (illustrated as direction A), and translate (e.g., slide) along the base member 108 in a substantially orthogonal second direction (illustrated as direction B). As shown, the device case 102 partially exposes the sleeve 110 and elongate base member 108 so as to make them accessible to a user of the pointing device system 100.

In certain examples, the system 100 may include one or more sensors disposed within the elongate base member 108 to detect at least one of the rotational movement and the axial movement of the sleeve 110. One or more switches are included within the case 102 of the pointing device system 100 and are positioned to detect a depression of the sleeve 110 (and/or the elongate base member 108) and initiate an action referred to herein as a "click operation" or "mouse click". For instance, the system 100 may include a click trigger positioned so as to activate responsive to an application of downward pressure to the sleeve 110. Such components are further discussed herein with reference to at least FIGS. 2-19. In various embodiments, the device case 102 also includes a cover which surrounds portions of the inner components of the device case 102, such as the click trigger, and protects the components from dust, dirt, moisture, and etc.

In various examples, the pointing device system 100 may communicate with the processor of a computer system, such as a desktop computer. There are many examples of computer systems that are currently in use. These examples include, among others, network appliances, personal computers, workstations, mainframes, networked clients, servers, media servers, application servers, database servers, and web servers. Other examples of computer systems may include mobile computer systems (e.g., smart phones, tablet computers, laptop computers, and personal digital assistants) and network equipment (e.g., load balancers, routers, and switches). Examples of particular models of mobile computer systems include iPhones, iPads, and iPod touches running iOS operating system available from Apple, Android devices like Samsung Galaxy Series, LG Nexus, and Motorola Droid X, Blackberry devices available from Blackberry Limited, and Areas Phone devices.

The computer system of various embodiments may include a processor, a memory, an interconnection element, an interface, and data storage element. To implement at least some of the aspects, functions, and processes disclosed herein, the processor performs a series of instructions that result in manipulated data. The processor may be any type of processor, multiprocessor or controller. Example processors may include a commercially available processor such as an Intel Xeon, Itanium, Core, Celeron, or Pentium processor; an AMD Opteron processor; an Apple A4 or A5 processor; a Sun UltraSPARC processor; an IBM Power5+ processor; an IBM mainframe chip; or a quantum computer. The processor is connected to other system components, including one or more memory devices, by the interconnection element.

The memory stores programs (e.g., sequences of instructions coded to be executable by the processor) and data during operation of the computer system. Thus, the memory may be a relatively high performance, volatile, random access memory such as a dynamic random access memory ("DRAM") or static memory ("SRAM"). However, the memory may include any device for storing data, such as a disk drive or other nonvolatile storage device.

Components of the computer system are coupled by an interconnection element. The interconnection element enables communications, including instructions and data, to be exchanged between system components of the computer system. The computer system also includes one or more interface devices such as input devices, output devices and combination input/output devices. Interface devices may receive input or provide output. More particularly, output devices may render information for external presentation. Input devices may accept information from external sources, such as various embodiments of the ergonomic pointing device described herein.

The data storage element includes a computer readable and writeable nonvolatile, or non-transitory, data storage medium in which instructions are stored that define a program or other object that is executed by the processor. The data storage element also may include information that is recorded, on or in, the medium, and that is processed by the processor during execution of the program.

Figure 2:
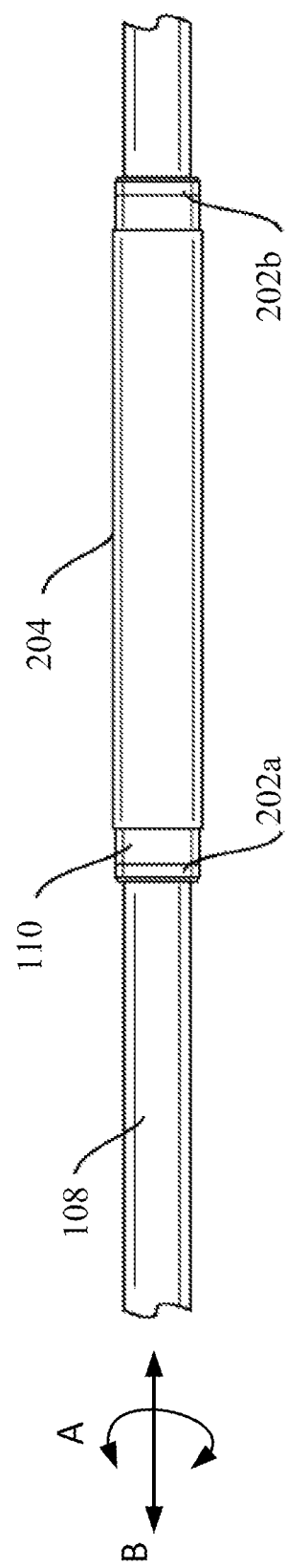
FIG. 2 illustrates one example of the elongate base member and the sleeve of the pointing device system illustrated in FIG. 1, according to aspects of the present disclosure.

FIG. 2 illustrates one example of the elongate base member 108 and the sleeve 110 shown in FIG. 1. For the purpose of illustration, arrow indicator A represents the first direction about which the sleeve 110 is configured to rotate, and arrow indicator B represents the second direction about which the sleeve 110 is configured to slide. As discussed herein, in certain examples the elongate base member is a hollow tube. In various embodiments, the sleeve 110 can include a tactile material disposed on an outside surface of the sleeve 110, such as a grip 204. The sleeve 110 may also be flexible and composed of one of plastic, cloth, paper, rubber, or other material. In certain embodiments, the sleeve 110 may be composed of a rigid material, and in particular, may take the shape of the elongate base member 108 (e.g., shown as a substantially cylindrical shape). However, in certain other examples the sleeve 110 may have a shape that is substantially different from a shape of the elongate base member 108.

In certain examples, the sleeve 110 may also include indicia printed on an outside surface thereof, and may be replaceable with a second sleeve by the user. As illustrated, in various embodiments, the sleeve 110 is supported on the elongate base member 108 by one or more bushings 202a, 202b that allow fluid rotation and sliding about the base member 108. Although the base member 108 and sleeve 110 are shown as including a generally tubular shape, in various additional embodiments, the base member 108 and sleeve 110 could include shapes having a generally non-circular cross-section, a cross-section having at least one flat surface and at least one curved surface, or a cross section having at least three rounded corners. The base member 108 may be composed of any durable material, such as aluminum. In various embodiments, the base member 108 is chosen to have a low coefficient of static friction between the base member 108 and sleeve 110 to provide fluid movement of the sleeve 110 about the base member 108.

Figure 3:
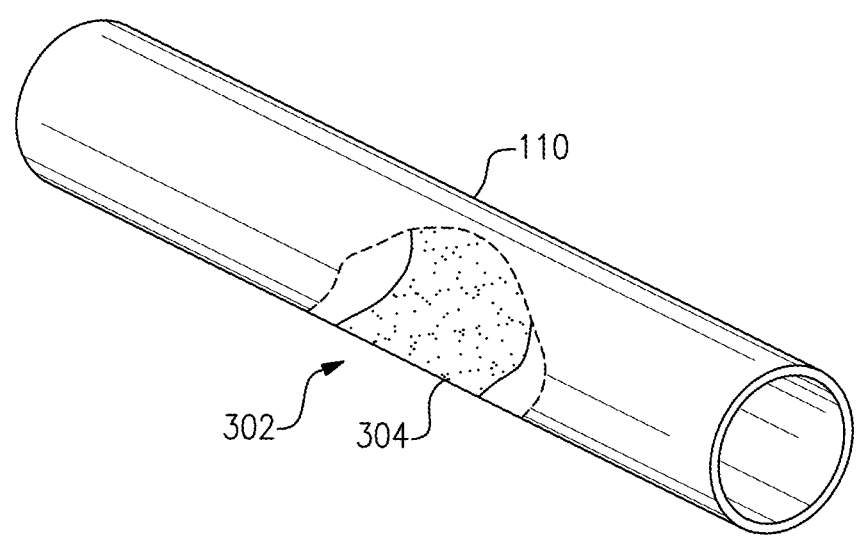
FIG. 3 is a cut-away view of the sleeve of the pointing device system illustrated in FIG. 1, according to aspects of the present disclosure.

Referring now to FIG. 3, one example of the sleeve 110 is illustrated. In particular, FIG. 3 illustrates a cut-away 302 of the sleeve 110 in which an inside (i.e., interior) surface of the sleeve 110 is viewable. As shown, in various examples the sleeve 110 includes a pattern 304 on the inside surface thereof. The pattern 304 may be printed, adhered, or otherwise formed on the inside surface of the sleeve 110. The pattern 304 may include a color pattern, a texture pattern, and/or any regular or irregular design on the inside surface. In specific examples, the pattern 304 may be positioned within a field of view of a sensor of the pointing device system 100 such that the sensor may detect at least one of a rotational movement and an axial movement of the sleeve 110, relative to the sensor (and to the elongate base member 108), based on a variation in the pattern 304 within the field of view. As discussed herein in certain examples, a variation in the pattern 304 may include movement of the pattern 304 relative to the sensor.

Figure 4A:
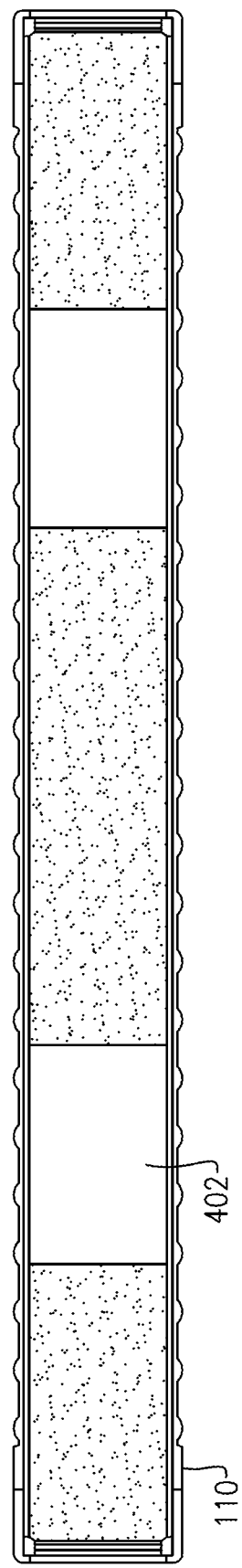
FIG. 4A is one example of a pattern that may be applied to the inside surface of a sleeve, according to aspects of the present disclosure.

Referring now to FIG. 4A, illustrated is one example of a pattern 402 that may be applied to the inside surface of the sleeve 110 shown in FIG. 1. Specifically, FIG. 4A illustrates one example of an alternating color pattern. The pattern extends along a length of the sleeve 110 (e.g., in the second direction B) and includes a plurality of alternating black cylindrical sections. While in the example of FIG. 4A the pattern 402 is shown as including alternating black cylindrical sections, other colors and shapes may be used in various other implementations. In one example, the pattern 402 may be divided into a plurality of zones, each zone corresponding to a function to be performed by a processor in communication with the sensor.

Turning to FIG. 4B, illustrated is one example of a zone assignment for the pattern 402 illustrated in FIG. 4A. Specifically, FIG. 4B illustrates a first zone (0), a second zone (1), a third zone (2), a fourth zone (3), and a fifth zone (4) divided along the length of the sleeve 110. However, in other examples any suitable number of zones may be implemented. In the shown example, the first zone 0 corresponds to a first black area of the pattern 402, the second zone 1 corresponds to a first white area (or non-color area) of the pattern 402, the third zone 2 corresponds to a second white area (or non-color area) of the pattern 402, the fourth zone 3 corresponds to a second black area of the pattern 402, and the fifth zone 4 corresponds to a third black area of the pattern 402. Each of the zones 0, 1, 2, 3, 4 may be arranged such that the black and white areas alternate along the length of the sleeve 110.

In certain examples, the first zone 0 corresponds to a work area of the pointing device system 100. During detection of the first zone 0 of the pattern 402 on the sleeve, by the sensor, the sensor communicates with the processor (e.g., the processor of a computer) to effect motion of the pointer in the visual display based on the detected motion of the sleeve 110. For instance, rotational movement and axial movement of the sleeve 110 may correspond to vertical and horizontal movements, respectively, of the pointer within the display. While the work area is illustrated as separate from the second zone 1, the third zone 2, the fourth zone 3, and the fifth zone 4, for the purpose of illustration, it is appreciated that the sensor may also detect sleeve movement in each of the other zones 1, 2, 3, 4. That is, during detection of each of the second zone 1, the third zone 2, the fourth zone 3, and the fifth zone 4 of the pattern 402 on the sleeve, the sensor may communicate with the processor to effect the motion of the pointer in the visual display based on the detected motion of the sleeve 110.

Each of the second zone 1 and third zone 2 correspond to an increase or decrease in a speed of the pointer in the visual display. Responsive to detection of the second zone 1 or third zone 2, the sensor communicates with the processor to increase the speed or decrease the speed of the pointer in the visual display. Lastly, the fourth zone 3 and fifth zone 4 each may indicate proximity of the sleeve 110 to a corresponding end of the elongate base member 108. That is, the fourth zone 3 indicates proximity of the sleeve 110 to a first end of the elongate base member 108 and the fifth zone 4 indicates proximity of the sleeve 110 to a second distal end of the elongate base member 108. Once the fourth zone 3 or fifth zone 4 is detected, the pointing device system 100 may prompt the processor to provide functionality for one or more "end detection" operations performed by the processor in communication with the pointing device system 100. For instance, the pointing device system 100 may provide functionality for cursor end detection, cursor end avoidance, or cursor auto centering.

In one example, end detection begins when the sleeve 110 reaches an end of the elongate base member 108. Once detected, the system 100 prompts the processor to automatically move a location of the pointer in the visual display in a corresponding direction continuously until the sleeve 110 is removed from the end of the elongate base member 108. In certain other examples, detection of the fourth zone 3 or fifth zone 4 by the sensor may alternatively prompt the processor to enter a "scroll" mode of operation. During the "scroll" mode, the user may rotate the sleeve 110 about the base member 108 to perform scrolling actions on information presented in the visual display.

In certain examples of the pointing device system 100, the elongate base member 108 may include a sensor disposed on a surface of the elongate base member or within the elongate base member 108 (i.e., an inner-sensor). The inner-sensor may be positioned to detect the rotational movement and/or axial movement of the sleeve 110 through an aperture in the elongate base member 108. In further examples, the inner-sensor may further detect proximity of the sleeve 110 to one or more ends of the elongate base member 108. Accordingly, in certain examples the pointing device system 100 may include a single sensor which detects all movements of the sleeve 110 (e.g., rotational, axial, and end detection). Such an example offers the benefits of improved power consumption, improved efficiency, and reduced size and complexity when compared to other pointing devices.

However, in certain other examples, the pointing device system 100 may include one or more additional sensors to detect the movement of the sleeve 110. For instance, the system 100 may include one or more linear Hall effect sensors which are positioned to monitor the momentary position of the sleeve 110 relative to the end of the elongate base member 108. For instance, the system 100 may include a first linear Hall effect sensor positioned at a first end of the elongate base member 108 and a second linear Hall effect sensor positioned at a distal second end of the elongate base member. Each linear Hall effect sensor may interact with a corresponding magnet to determine the proximity of the sleeve to the corresponding end of the sleeve. Once a predetermined threshold between the linear Hall effect sensor and corresponding magnet is reached (i.e., the magnet and the linear Hall effect sensor reach a predetermined proximity), the processor may be prompted to enter a "scroll" mode and/or perform one or more end detection operations, as further discussed herein.

FIG. 5A illustrates another example of a pattern 502 that may be applied to the inside surface of the sleeve 110 shown in FIG. 1. The pattern extends along a length of the sleeve 110 (e.g., in the second direction B) and includes a plurality of alternating black cylindrical sections. Similar to the pattern 402 illustrated in FIG. 4A, the pattern 502 may be divided into a plurality of zones, each zone corresponding to a function to be performed by the processor in communication with the pointing device system 100

Figure 5B:
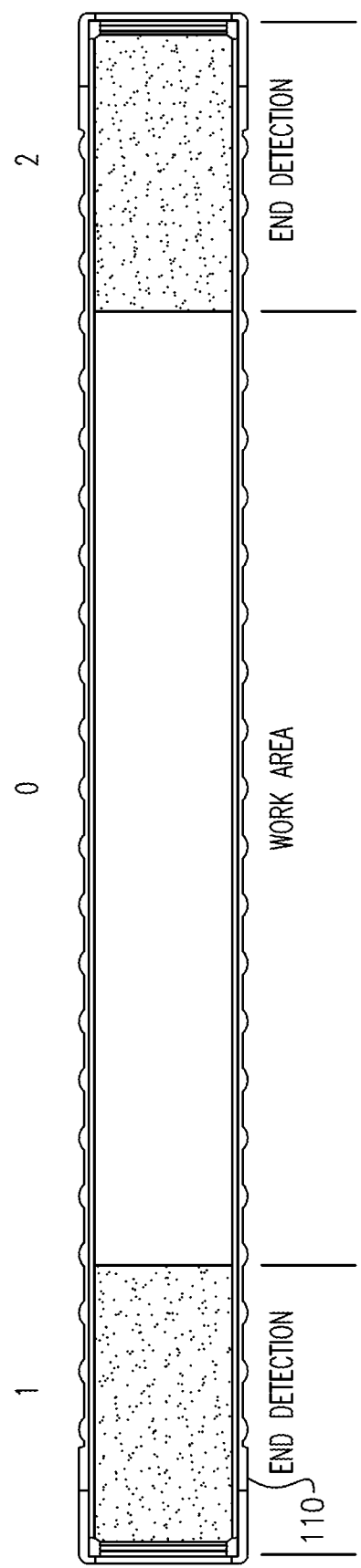
FIG. 5B is an example zone assignment of the pattern illustrated in FIG. 5A, according to aspects of the present disclosure.

FIG. 5B illustrates one example of a zone assignment for the pattern 502 illustrated in FIG. 5A. Specifically, FIG. 5B illustrates a first zone (0), a second zone (1), and a third zone (2). However, in other examples any suitable number of zones may be implemented. In the shown example, the first zone 0 corresponds to a first white area (or non-color area) of the pattern 502, the second zone 1 corresponds to a first black area of the pattern 502, and the third zone 2 corresponds to a second black area of the pattern 502. In certain examples, the first zone 0 corresponds to a work area of the pointing device system 100 and each of the second zone 1 and third zone 2 indicates a proximity of the sleeve 110 corresponding end of the elongate base member 108.

In certain examples, the sensor is a laser sensor, or an optical sensor, that emits and detects light through the aperture. The sensor detects movement of the sleeve 110 based at least in part on a variation in the pattern on the inside surface of the sleeve 110 during movement of the sleeve 110. FIG. 6A shows a cross-sectional view of one example of a pointing device system 600 including an inner-sensor 602 positioned within an elongate base member 610. FIG. 6B shows an enhanced view of the inner-sensor 602 illustrated in FIG. 6A. The inner-sensor 602 may be mounted to a sensor housing 604, which is attached to a sensor circuit board 606 within the elongate base member 610 or on a surface of the elongate base member 610. While in one example the inner-sensor 602 includes a laser sensor, in certain other examples any suitable type of sensor may be used, such as any other suitable optical sensor. In one example, the inner-sensor 602 provides light to, and detects light reflected from, the inside surface of the sleeve (e.g., sleeve 110 of FIG. 1). Movement of the sleeve varies the pattern in the field of view of the inner-sensor 602, and the characteristics of light reflected from the inside surface of the sleeve.

A sensor support 608 secures the sensor circuit board 606, and the inner-sensor 602, within the elongate base member 610. As illustrated, the sensor support 608 secures the inner-sensor 602 and sensor circuit board 606 at about the center of the elongate base member 610 such that the sensor 602 can maintain optical contact with the sleeve, regardless of sleeve positioning along the base member 610. In various examples, the elongate base member 610 has an aperture through which the sensor 602 is in optical contact with the inside surface of the sleeve. Movements detected by the sensor 602 are communicated to other system components (e.g., a processor in communication with the pointing device system 600) through at least the sensor circuit board 606. While in one example the pattern on the inside surface of the sleeve may facilitate end proximity detection, in certain other examples, the corresponding pointing device system 600 may also (or alternatively) include one or more end-detection sensors, such as contact switches.

Figure 7:
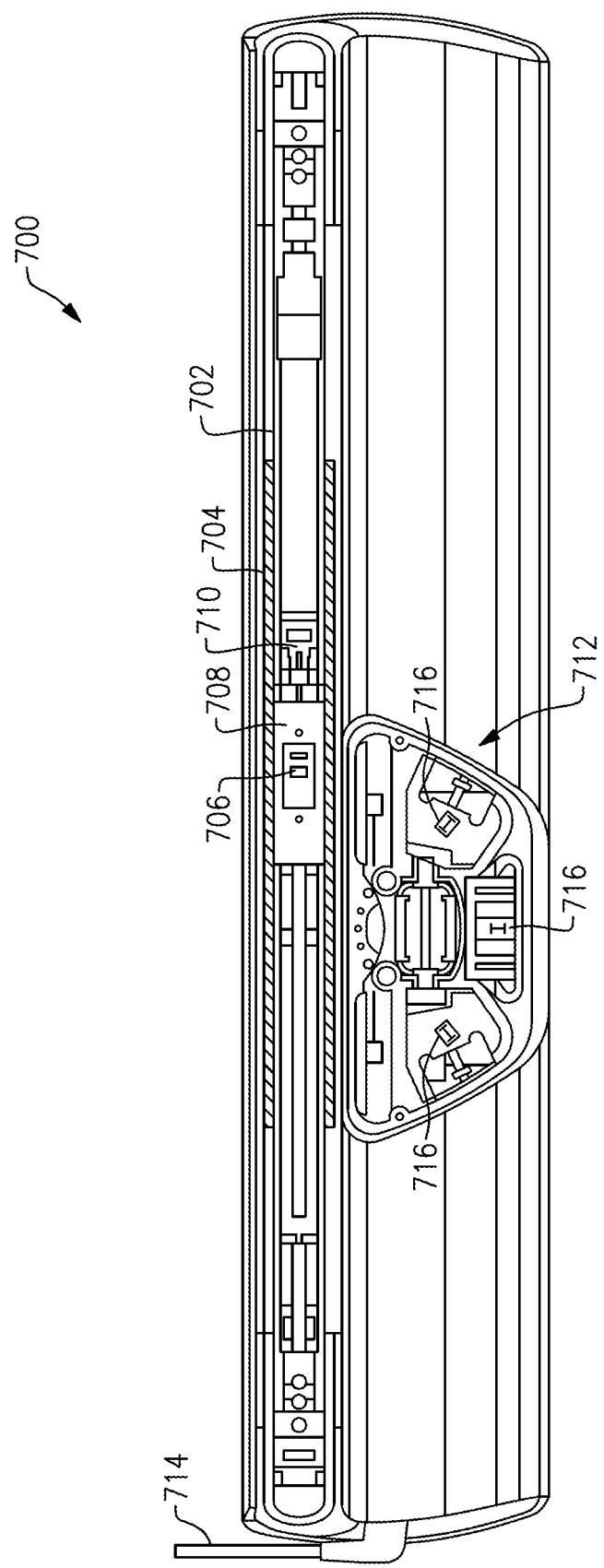
FIG. 7 is another example of a pointing device system including an inner-sensor, according to aspects of the present disclosure.

Referring now to FIG. 7, illustrated is a plan view of a pointing device system 700 according to certain aspects and examples. Among other components, FIG. 7 shows the system 700 as including an elongate base member 702, a sleeve 704, an inner sensor 706, a sensor circuit board 708, a centrally located sensor support 710, one or more switches 716, a circuit board 712, and a wired connection 714, among other components. Activation of any one of the switches 716 permits the user to perform a function generally performed by a conventional mouse. For example, each switch 716 may have a corresponding button, such as a scroll wheel, a copy button, a paste button, a left click button, a double click button, or a right click button.

Accordingly, each of the switches 716 may represent an action, such as Copy, Paste, Right click, Left click, or Double click. Depression of a corresponding button may activate that switch and generate a signal to perform the given action. Each switch 716 may additionally provide audio feedback (e.g., a click sound) to indicate to the user that the corresponding action has occurred. Each of the illustrated switches 716 may be independently programmable and may be assigned an action based on user preference. It is also to be understood that while described above as individually configured to perform Copy, Paste, Right click, Left click, or Double click functions, in various further embodiments, the plurality of switches 716 shown in FIG. 7 may also be configurable by the user to perform a user defined function.

As discussed above, various embodiments of the pointing device system 700 may be configured to communicate with a computer system, or similar device, and translate the motion of the sleeve 704 relative to the elongate base member 702 into motion of a pointer on the visual display of the computer system. For example, communication may include communication through the wired connection 714, which may include a cable, for example. However, in various additional embodiments, the pointing device system 700 is characterized by the absence of a wired connection to the corresponding computer system. That is, the wired connection may be replaced with a wireless connection. Generally, the replacement of wires connecting the pointing device system 700 and computer system with a wireless transmitter/receiver further improves the ergonomics of the pointing device system 700 and removes obstructions from the workspace of the user.

Accordingly, in one embodiment the circuit board 712 further includes a transmitter circuit including a wireless transmitter/receiver for wireless communication with a wireless transmitter/receiver at the computer system. For example, the transmitter can include a radio frequency (RF) transmitter, which can for example be in the form of a USB type device that can be connected to a USB port. A controller is electrically connected to, or otherwise associated with, the transmitter, and causes transmission of data regarding the detected rotations and translations of the sleeve 704. Transmitted motion of the sleeve 704 is translated by computer interface circuitry to cursor control signals for the visual display. The transmitter encodes and transmits information including movement of the sleeve 704 about the base member 702, click operations, and button activation. The receiver is configured to accept the transmission and responsively decode the information. In various embodiments, the receiver is configured to plug-in to a peripheral mouse input of the computer system. To minimize interference, the transmitter and receiver of one embodiment may be configured to operate at a frequency of 2.4 Ghz. It is also appreciated that various embodiments may use BLUETOOTH® transmitter/receiver, or any other wireless signal transmitter/receiver as used in the art, to communicate between the pointing device system 700 and the computer system. As used herein, BLUETOOTH® refers to a short range ad hock network, otherwise known as piconet.

While not explicitly illustrated in FIG. 7, the pointing device 700 may also include a rechargeable power source. In various embodiments, the rechargeable power source includes a rechargeable battery. The power source is in electrical communication with, and configured to provide electrical power to, components disposed on the circuit board 712. For example, the rechargeable power source of one example may include a rechargeable lithium-ion (LiOn) battery.

In various embodiments, the circuit board 712 further includes a universal serial bus (USB) circuit configured to supply power provided by a USB cable to the power source. In certain embodiments, the pointing device system 700 may also be configured to communicate with the computer system via the USB cable. For example, the pointing device system 700 may be configured to transmit information, such as detected sleeve 704 movement and click operations, to the computer system via the cable. Accordingly, the USB circuit may be in selective communication with the circuit board 712 and various other system 700 components, such as the sensor circuit board 708. In various embodiments, the USB cable is removable and the pointing device system 700 is configured to be free of all wired connections to the computer system.

Referring now to FIGS. 8A and 8B, illustrated is another example of a pointing device system 800. In particular, FIGS. 8A and 8B shows a pointing device system 800 including an elongate base member 802, a sleeve 804 disposed to fit over at least a portion of the elongate base member 802, a click trigger 806, a first support bracket 808a, a second support bracket 808b, a support rod 810 extended between the first support bracket 808a and second support bracket 808b, a flange 812 coupled along the support rod 810, a device case including a base 814, and one or more switches 820, among various other components. A rear-side of the base 814 is adapted to be placed on a suitable workspace surface, such as a desktop surface. Similar to the sleeve 110 described with reference to at least FIGS. 1 and 2, the sleeve 804 illustrated in FIGS. 8A-8B is configured to rotate about the elongate base member 802 in a first direction and slide about the elongate base member 802 in a second direction substantially orthogonal to the first direction. One or more sensors positioned within, or along a surface of, the elongate base member 802 may detect the movement of the sleeve 804 based on the techniques and processes described herein.

As illustrated, the first support bracket 808a may be coupled to a first end of the elongate base member 802, and the second support bracket 808b may be coupled to a second end of the elongate base member 802. In particular, the first support bracket 808a may be coupled to the elongate base member 802 at a first end of the first support bracket 808a and coupled to the support rod 810 at a distal second end of the first support bracket 808a. Similarly, the second support bracket 808b may be coupled to the elongate base member 802 at a first end of the second support bracket 808a and coupled to the support rod 810 at a distal second end of the second support bracket 808b. That is, each of the first and second support brackets 808a, 808b may extend outward from the base member 802 in a substantially perpendicular direction. In this manner, the first support bracket 808a and the second support bracket 808b may be positioned so as to suspend the elongate base member 802 relative to the device base 814 to allow depression of the sleeve 804 (and elongate base member 802) to engage the click trigger 806.

In the illustrated example, the support rod 810 extends between the first support bracket 808a and the second support bracket 808b in a direction substantially parallel to the length of the elongate base member 802. The first support bracket 808a and second support bracket 808b are each coupled to a respective end of the support rod 810 and positioned to displace the support rod 810 responsive to the application of downward pressure to the sleeve 804 or elongate base member 802. In various examples, depression of the sleeve 804 or elongate base member 802 causes a downward force on the first end of the first support bracket 808a and the first end of the second support bracket 808b. The downward force results in a substantially opposite force at the second end of the first support bracket 808a and second support bracket 808b, respectively, which generates a rotational force about the support rod 810.

As illustrated, the flange 812 may be coupled along the support rod 810 and positioned to apply pressure to the click trigger 806. In particular, rotation of the support rod 810 (e.g., responsive to downward pressure on the sleeve 804) causes a vertical displacement of the flange 812, and application of proportional pressure on the click trigger 806. In this manner, the flange 812 is configured to apply a substantially proportional pressure to the click trigger 806 relative to the downward pressure applied to the sleeve 804 or elongate base member 802. After a predetermined pressure threshold is exceeded at the click trigger 806, a click operation is generated. As further described herein, when a click operation is generated an audible click (i.e., a click sound) may also be generated, for instance by a Piezoelectric device. The typical downward pressure (also referred to as a "pick force") necessary to achieve a click operation may be between 50 and 120 grams of force.

While in certain examples the click trigger may include a mechanical switch, in various other implementations the click trigger may include a contactless click trigger. That is, while FIGS. 8A-8B illustrate the click trigger 806 as including a mechanical switch with an actuator positioned on the base 814, in certain other examples the click trigger 806 may be positioned in other locations, and may be another type of contact or contactless sensor. In one example, the click trigger 806 may include one or more contactless sensors positioned at an end of the elongate base member 802. For instance, each contactless sensor may include a Hall effect sensor which interacts with a magnet (or other magnetic source). Application of downward pressure to the sleeve 804 or elongate base member 802 increases a proximity of the Hall effect sensor to the corresponding magnet. Once a predetermined threshold is reached (i.e., the magnet and Hall effect sensor reach a predetermined proximity) a click operation is generated.

In a particular example, the pointing device system 800 may have a first Hall effect sensor at a first end of the elongate base member 802 and a second Hall effect sensor at a distal second end of the elongate base member 802. In such an example, a click operation may be generated if the threshold for one of the first Hall effect sensor and the second Hall effect sensor is reached, and/or if both of the thresholds are reached. It is appreciated that in the examples where the click trigger includes a Hall effect sensor, the flange 812 and the support rod 810 may be removed from the pointing device system 800.

It is appreciated that the amount of pressure desired to generate a click operation may largely depend on user preferences, as well as the corresponding operations performed by the computer in communication with the pointing device system 800. Accordingly, in certain examples the system 800 may further include a click pressure adjuster 816 positioned proximate the click trigger 806 and configured to adjust the downward pressure that activates the click trigger 806. In at least one example, the click pressure adjuster 816 may include a leaf spring 818 and a sliding fulcrum. In FIG. 8A, the sliding fulcrum is obscured by the leaf spring 818.

Similar to the pointing device system 700 illustrated in FIG. 7, in certain examples, the pointing device system 800 of FIG. 8A may also include one or more switches 820 which correspond with typical operations performed by a conventional mouse. Accordingly, each switch 810 may have a corresponding button 822, each of which are shown in the illustration of the pointing device system 800 in FIG. 8B. Depression of any one of the buttons 822 activates the corresponding switch 820 and permits the user to perform a corresponding function generally performed by a conventional mouse, such as Copy, Paste, Right click, Left click, or Double click.

Figure 9:
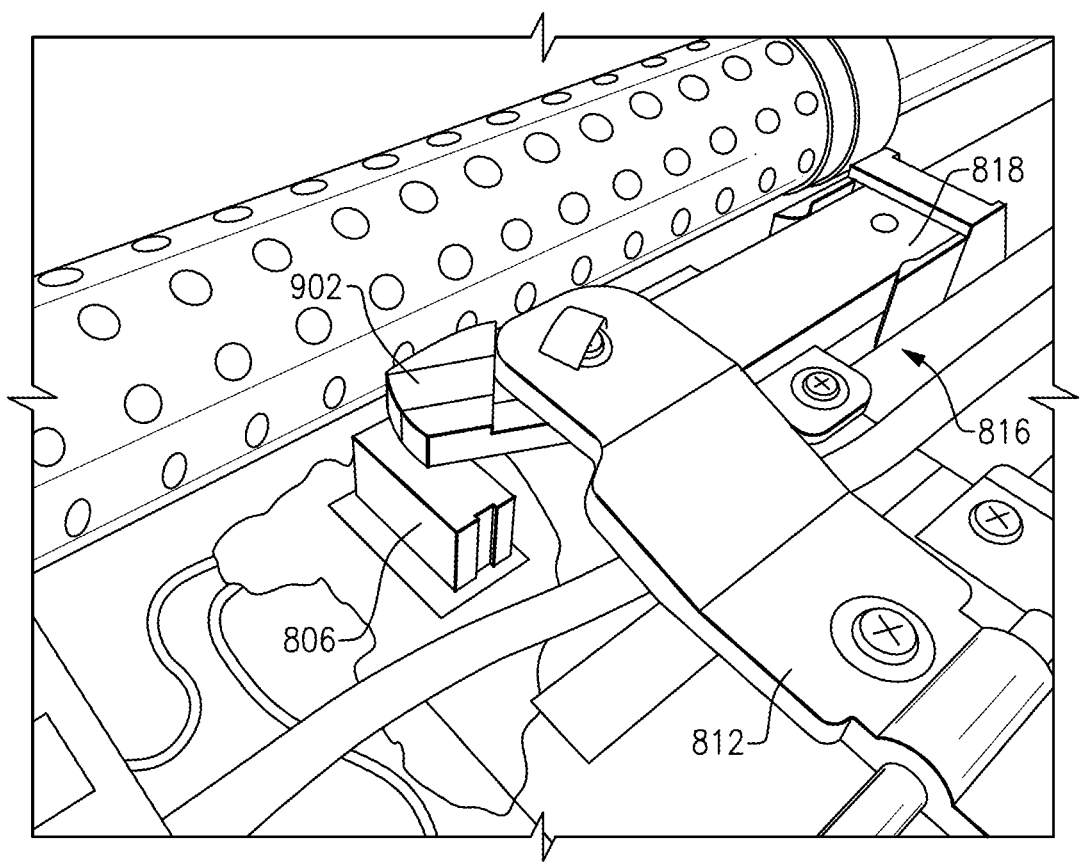
FIG. 9 is an enhanced view of the click trigger of the pointing device system illustrated in FIG. 8A, according to aspects of the present disclosure.

Turning to FIG. 9, illustrated is an enhanced view of the click trigger 806, flange 812, and click pressure adjuster 816 of FIG. 8A. As illustrated, the flange 812 may include an angular projection 902 which extends from the flange 812 to engage the click trigger 806. The leaf spring 818 of the click pressure adjuster 816 may be interposed between the flange 812 and the sliding fulcrum to provide a resistive force in a direction substantially opposite the the pressure applied by the angular projection 902. In particular, the sliding fulcrum may be coupled to the base 814 of the device case and slide along a length of the leaf-spring 818 to increase or decrease the resistive force. As will be readily apparent to one of ordinary skill in the art given the benefit of this disclosure, as the sliding fulcrum is positioned closer to the flange 812 the resistive force applied by the click pressure adjuster 816 increases, and as the sliding fulcrum is positioned farther away from the flange 812 the resistive force applied by the click pressure adjuster 816 decreases.

Figure 10:
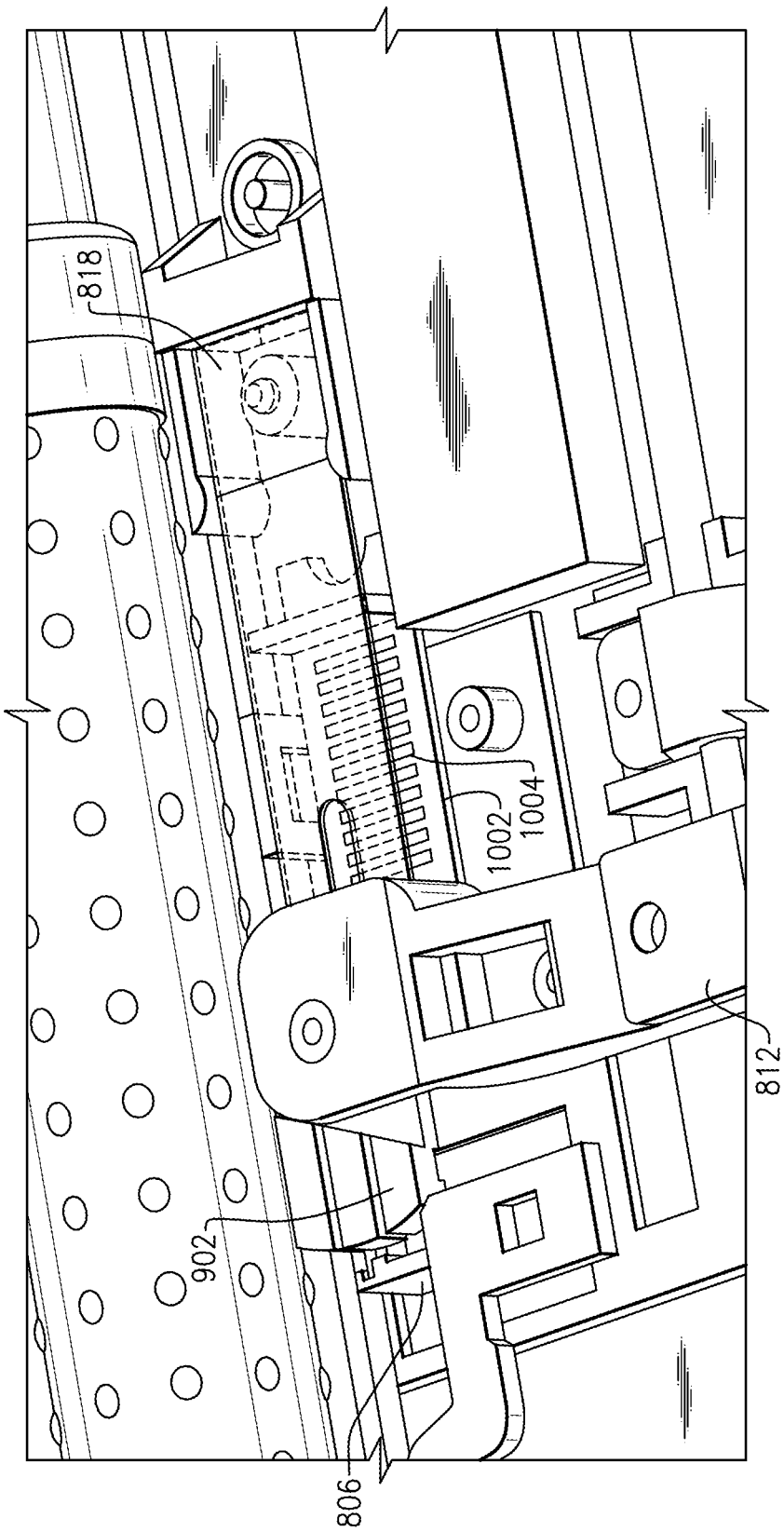
FIG. 10 is another enhanced view of the click trigger of the pointing device system illustrated in FIG. 8A, according to aspects of the present disclosure.
Figure 11A:
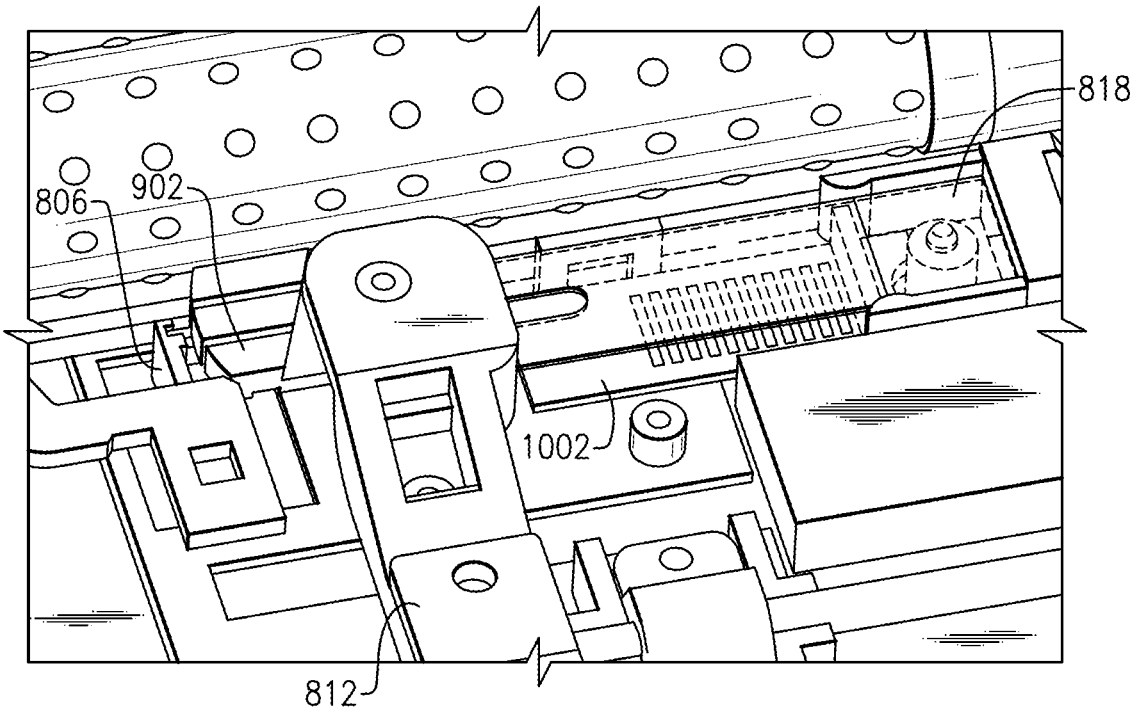
FIG. 11A illustrates an example position of the sliding fulcrum of the pointing device system illustrated in FIG. 8A, according to aspects of the present disclosure.
Figure 11B:
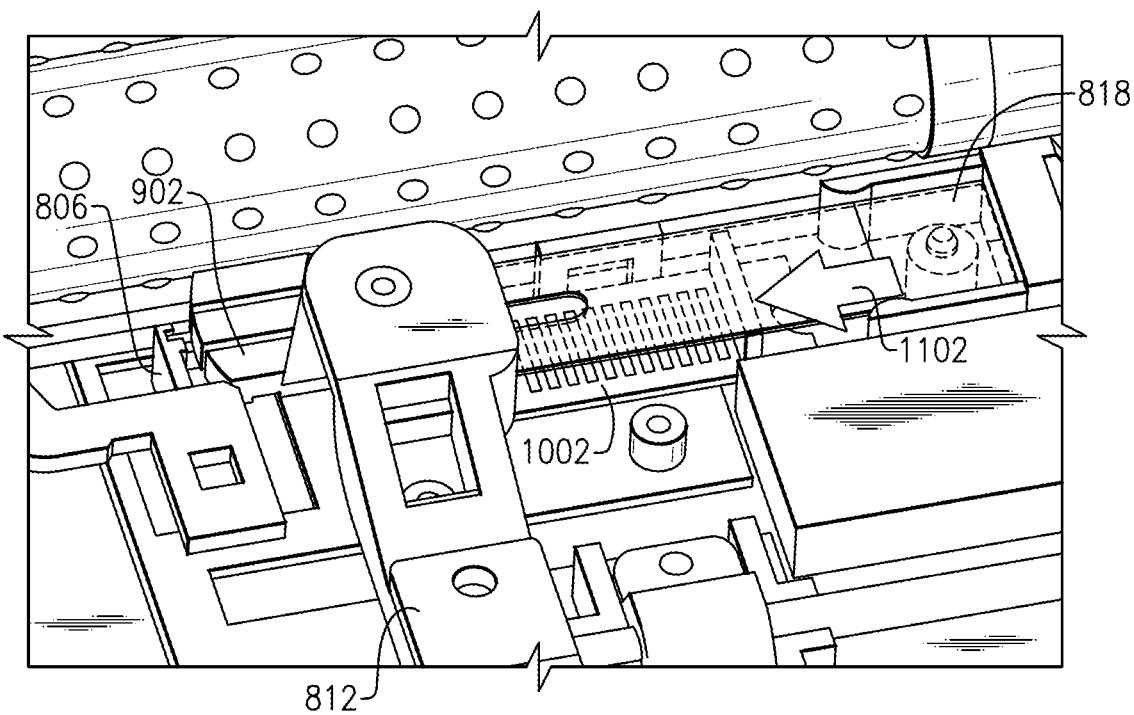
FIG. 11B illustrates another example position of the sliding fulcrum of the pointing device system illustrated in FIG. 8A, according to aspects of the present disclosure.

Referring now to FIG. 10, illustrated is another enhanced view of the click trigger 806, flange 812, and the click pressure adjuster 816 of FIG. 8. In particular, the sliding fulcrum 1002 is viewable in FIG. 10. As illustrated, the sliding fulcrum 1002 may have a plurality of selectable notches 1004, each notch corresponding to a position of the sliding fulcrum 1002 along the leaf spring 818. The sliding fulcrum 1002 may translate along a track beneath the leaf spring 818 to adjust the pressure required to activate the click trigger 806. In particular, the sliding fulcrum 1002 may translate along a length of the leaf spring 818 between a fixed end of the leaf spring 818 and a distal end which is coupled to the flange 902. FIGS. 11A and 11B show two different selectable positions of the sliding fulcrum 1002. In FIG. 11B, an arrow 1102 illustrates a direction of translation of the sliding fulcrum 1002.

Figure 12:
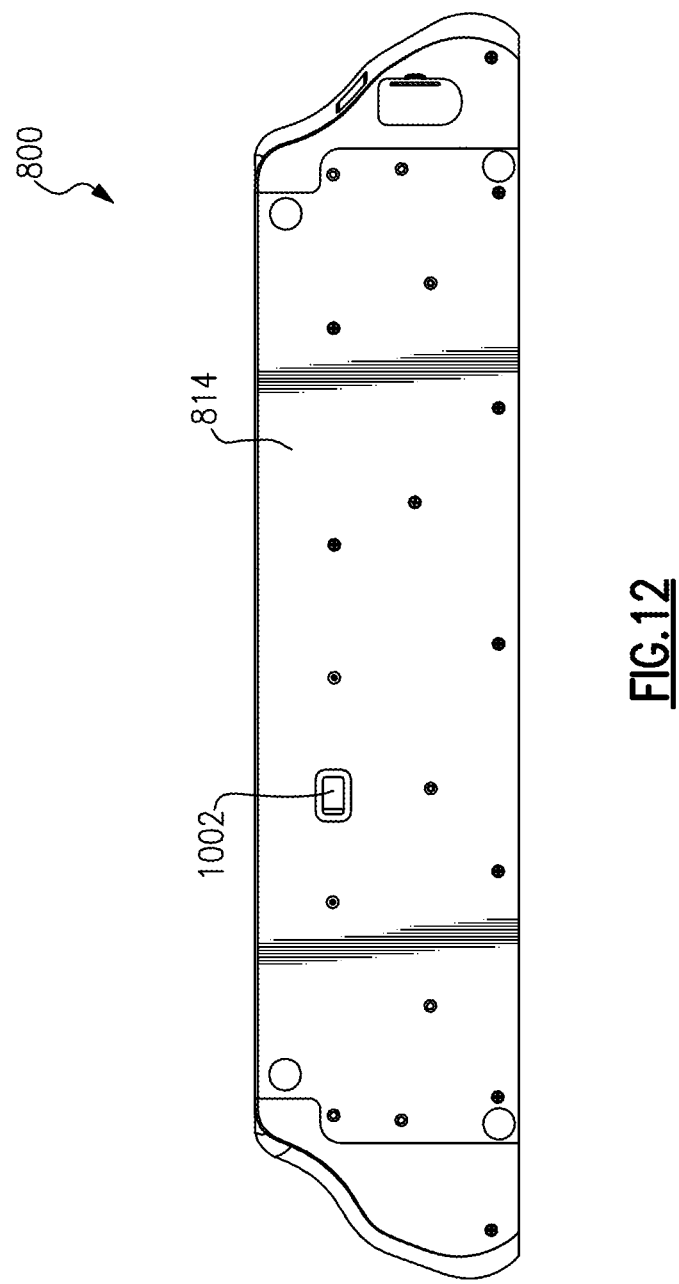
FIG. 12 illustrates a rear-side view of the pointing device system illustrated in FIG. 8A, according to aspects of the present disclosure.

In various examples, the sliding fulcrum 1002 is positioned in a location accessible to a user. For instance, the sliding fulcrum 1002 may be accessible through a rear side of the device case base 814, as illustrated in FIG. 12. Movement of the sliding fulcrum 1002, by the user, translates the fulcrum 1002 along the track and, accordingly, adjusts the pressure required to activate the click trigger 806. While FIG. 12 shows one illustrative position of the sliding fulcrum 1002, in various other examples the sliding fulcrum 1002 may be positioned in other locations easy accessible to a user of the pointing device system 800.

Figure 13:
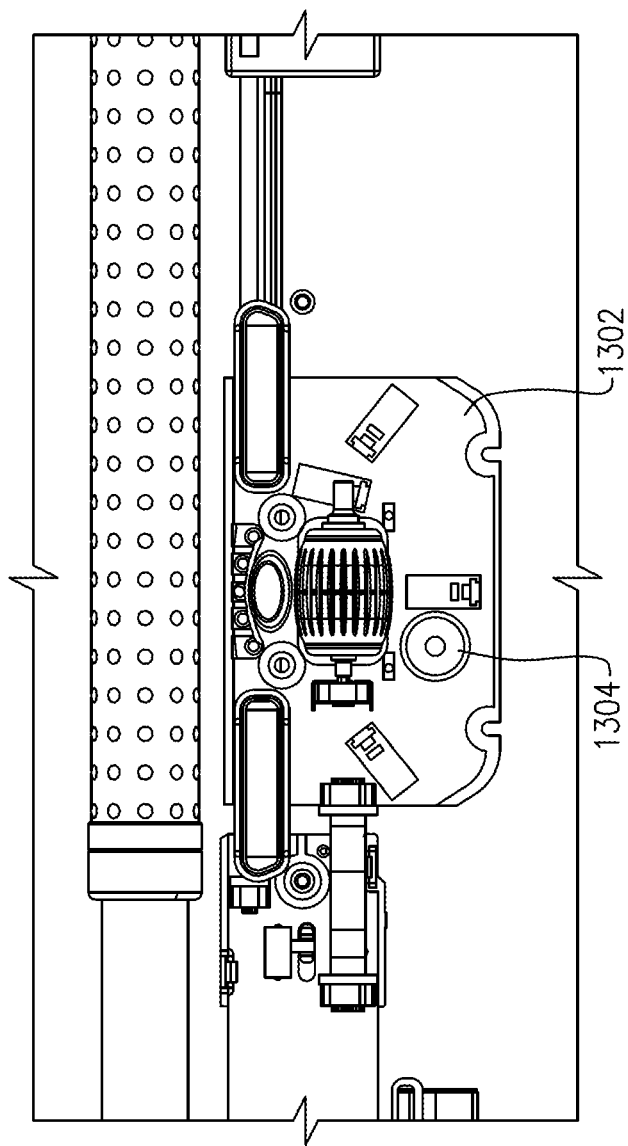
FIG. 13 illustrates one example of a circuit board, according to aspects of the present disclosure.

Referring now to FIG. 13, illustrated is one example of a circuit board 1302, which may be included within the device case of a pointing device system discussed herein. For instance, the circuit board 1302 of FIG. 13 may be included in any of the pointing device systems illustrated in FIGS. 1, 7, and/or 8A and 8B, to name a few. In various examples, the circuit board 1302 may be coupled to and in communication with a sensor (e.g., via the sensor circuit board 708 illustrated in FIG. 7), one or more switches, a click trigger, and one or more other components of the pointing device system. In particular, the circuit board 1302 may be configured to transmit and receive data with the processor of a computer system responsive to detected movement of a sleeve about the elongate base member. Various components of the pointing device systems discussed herein are mounted to either a single common printed circuit board, or distributed among more than one printed circuit board. While illustrated in FIG. 13 as a single circuit board, in various other examples, the circuit board 1302 may be implemented as a main circuit board in electrical communication with a secondary circuit board. The circuit board 1302 may be secured to the device case via one or more fasteners (e.g., screws).

Figure 14:
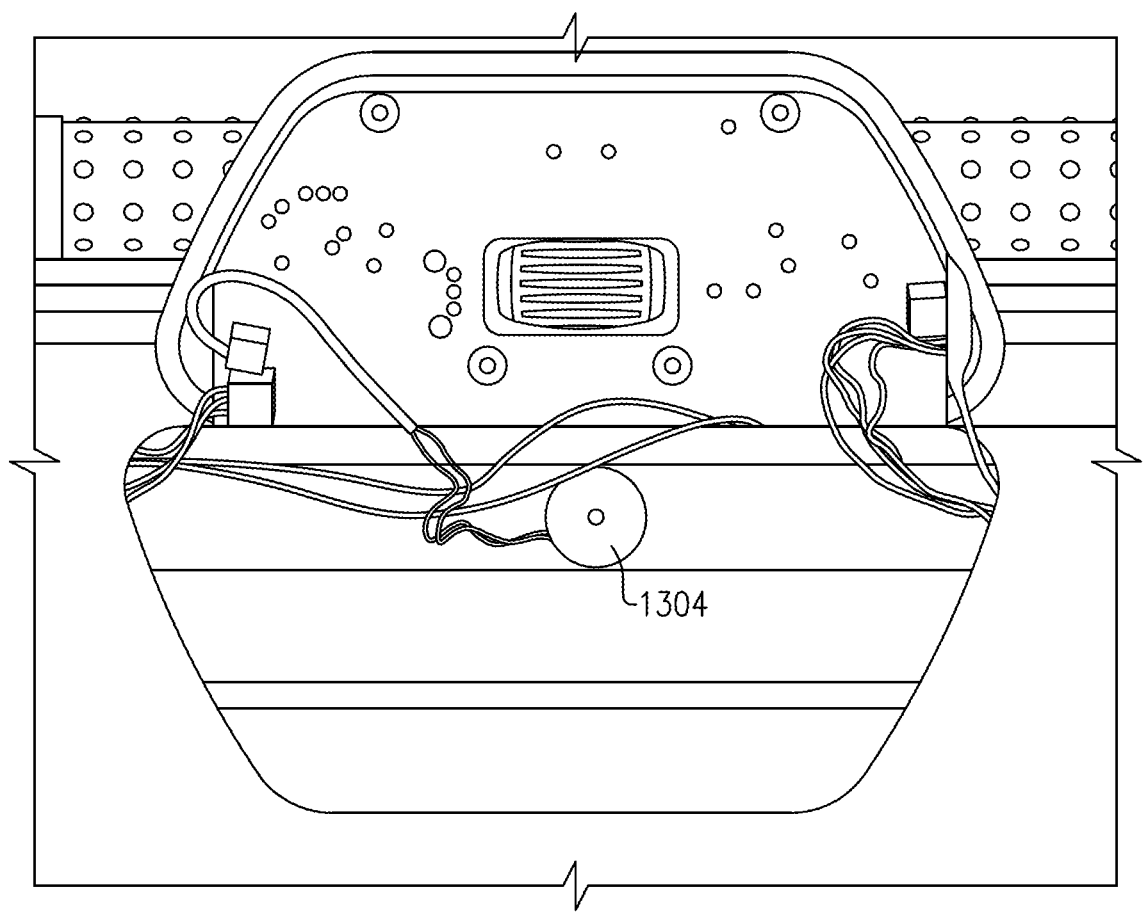
FIG. 14 illustrates one example of a Piezoelectric device, according to aspects of the present disclosure.

As illustrated in FIG. 13, in certain examples the pointing device systems described herein may also include a Piezoelectric device 1304. The Piezoelectric device 1304 is configured to generate an audible click responsive to activation of a click trigger. In certain implementations, the Piezoelectric device 1304 may be positioned on the circuit board 1302 and may be in communication with the click trigger. In particular, the Piezoelectric device 1304 may generate an audible click which imitates the noise of a mechanical switch. For instance, the Piezoelectric device 1304 may be a Piezoelectric buzzer. In certain other examples, the Piezoelectric device 1304 may be positioned directly on a device case, as illustrated in FIG. 14, or in any other suitable location within the pointing device system.

While FIGS. 1-14 illustrate some examples of a pointing device system, and components thereof, aspects of the disclosure should not be limited to those specific examples discussed with reference to FIGS. 1-14. Many modifications and variations may become apparent in light of the above teachings. For example, FIGS. 15-19 each illustrate different pointing device system arrangements, in which the various aspects and teachings of this disclosure may be incorporated. Moreover, various aspects of the pointing device system arrangements illustrated in FIGS. 15-19 may be incorporated in those examples discussed with reference to FIGS. 1-14.

Figure 15:
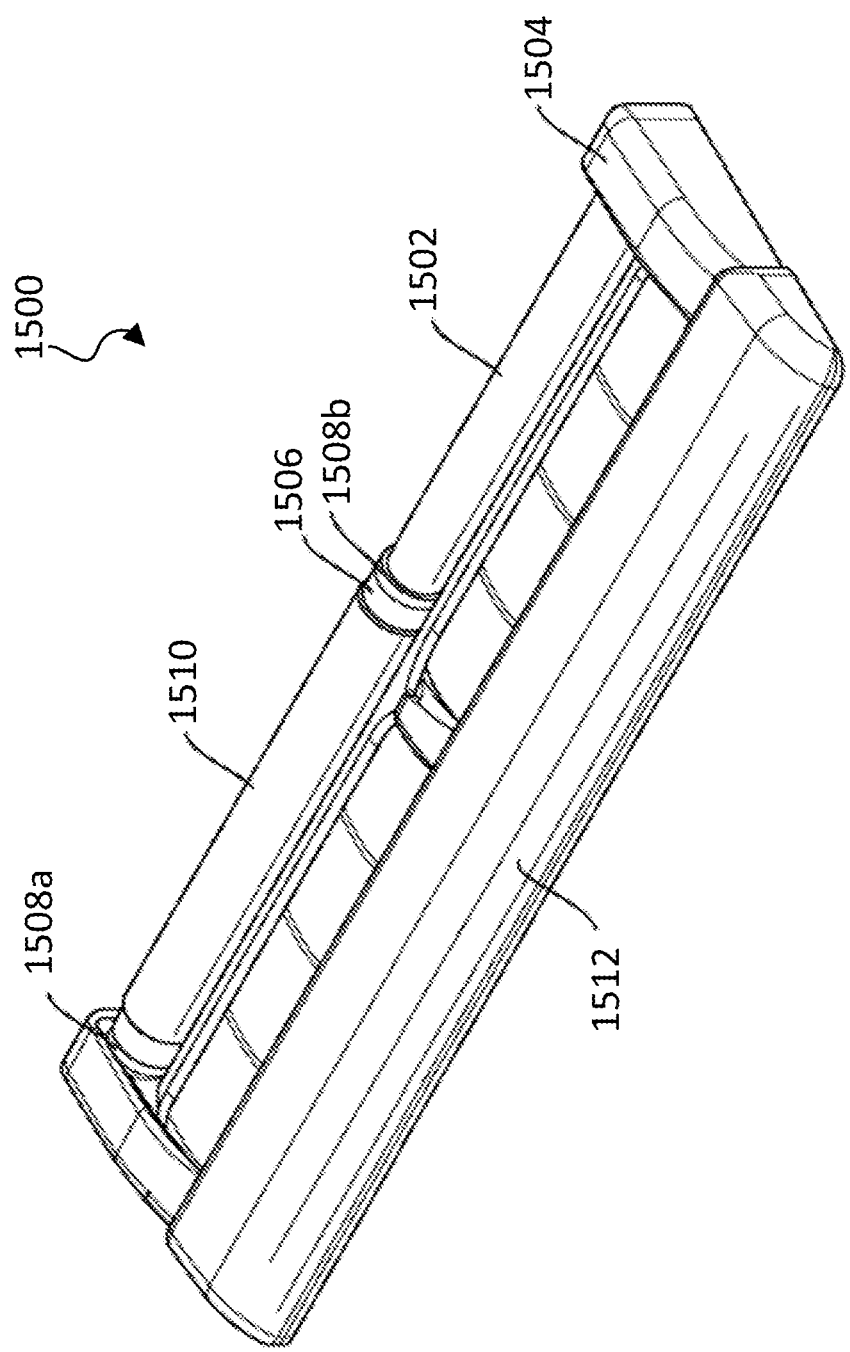
FIG. 15 illustrates another example of a pointing device system according to aspects of the present disclosure.
Figure 16:
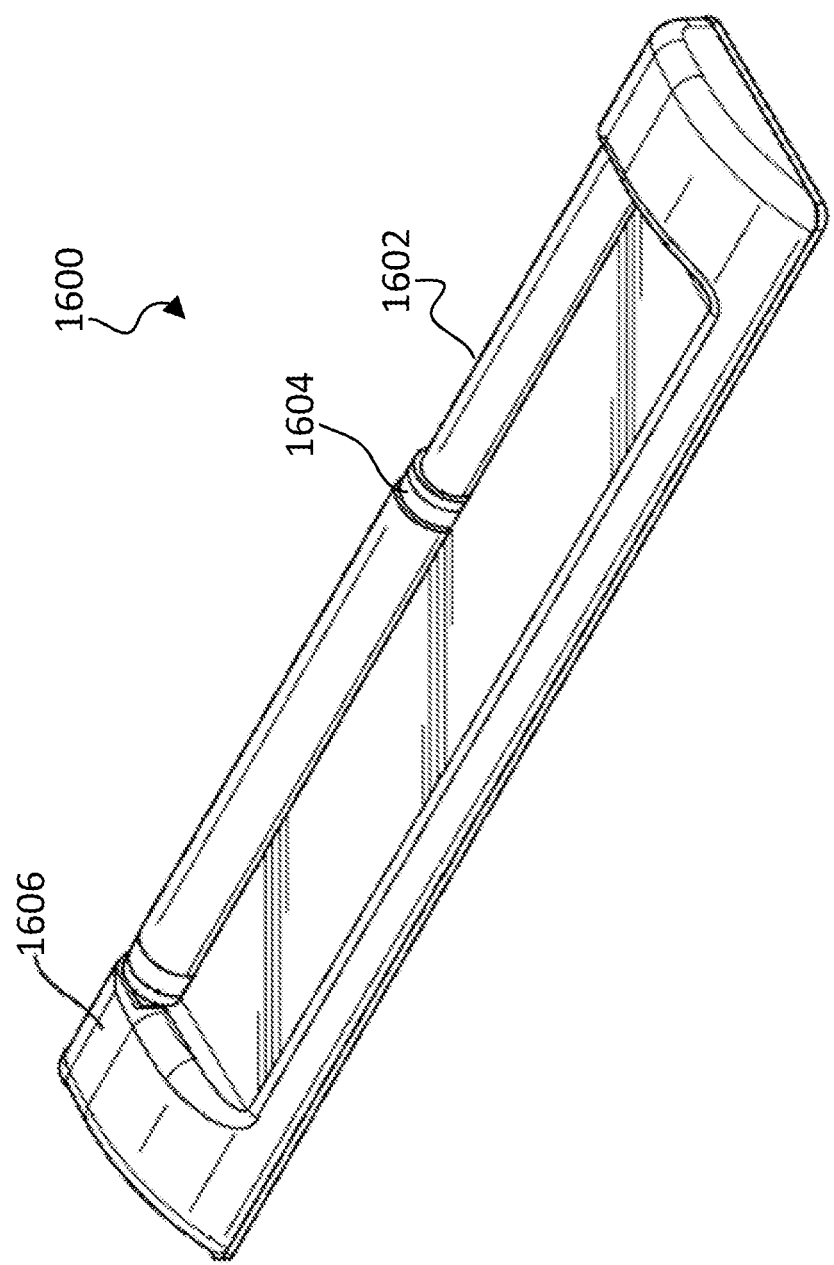
FIG. 16 illustrates a further example of a pointing device system according to aspects of the present disclosure.

For instance, referring to FIGS. 15 and 16, illustrated are other examples of an inner-sensor pointing device system. In FIG. 15, the pointing device system 1500 is shown as including an elongate base member 1502 and a device case 1504. The device case 1504 may contain additional parts, such as a circuit board, a click trigger, one or more switches, and a Piezoelectric device, among other components. As illustrated, the pointing device 1500 also includes a sleeve 1506 which fits over a portion of elongate base member 1502. Sleeve 1506 is rotatable about a portion of the elongate base member 1502, and is also slidable along a length of the elongate base member 1502. Similar to the sleeve 110 illustrated and discussed with reference to at least FIGS. 1 and 2, the sleeve 1506 is supported by bushings 1508a and 1508b, and may include a grip 1510 on an exterior surface. Also shown is a wrist support 1512.

FIG. 16 illustrates a pointing device system 1600 having a similar arrangement to that of the pointing device system 1500 shown in FIG. 15. In particular, FIG.16 shows an elongate base member 1602, a sleeve 1604, and a device case 1606. The device case 1606 surrounds portions of additional components of the pointing device system 1600, such as a circuit board, one or more switches, and a Piezoelectric device, among other hardware, and protects those components from dust, dirt, moisture and the like. Different covers and different layouts may be implemented and may be adjusted based on the intended location of the pointing device system 1600 (e.g., a desktop, a remote computer terminal, etc.).

Figure 17:
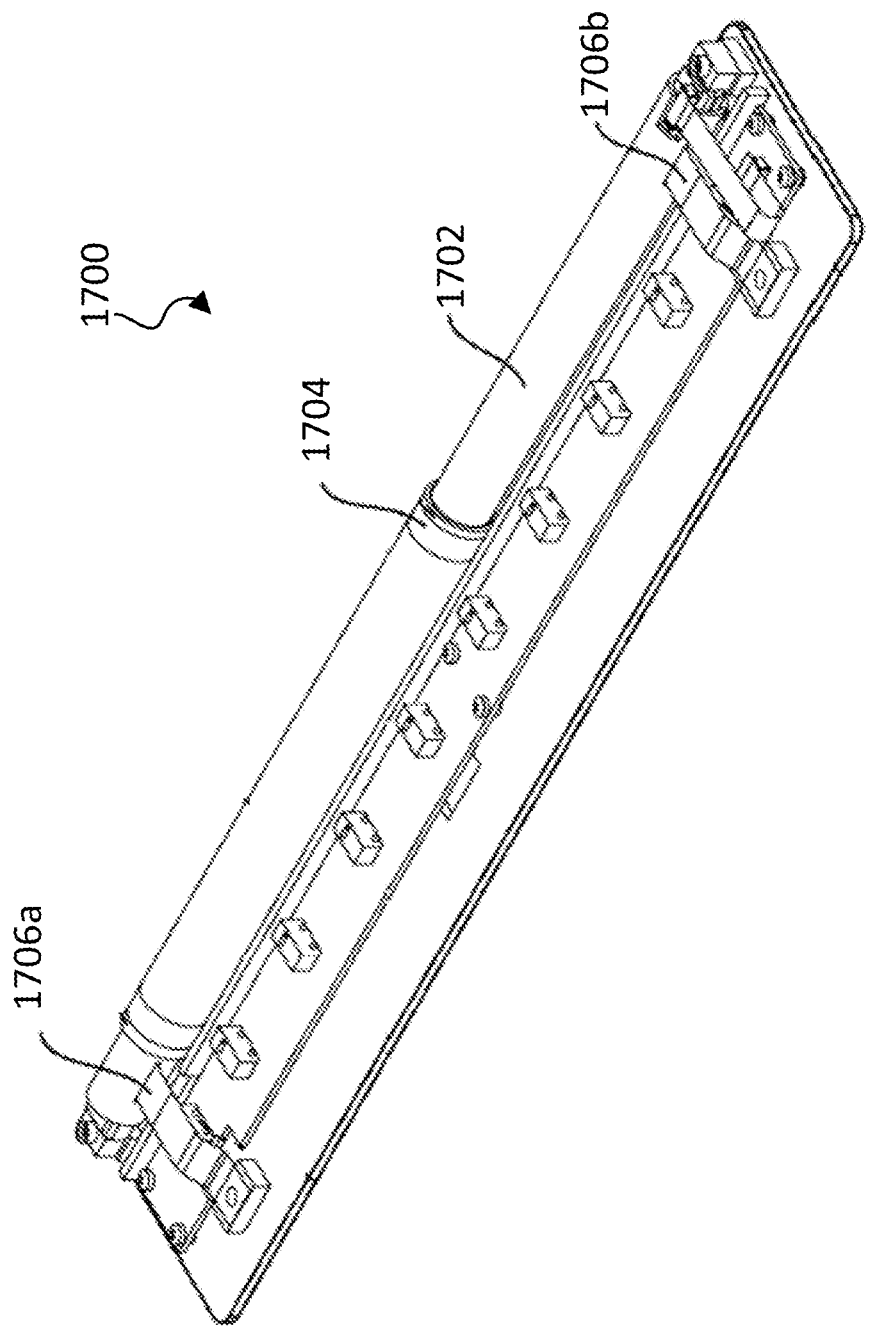
FIG. 17 illustrates a transparent view of an example pointing device system according to aspects of the present disclosure.

Referring now to FIG. 17, one example of a pointing device system, and roller-bar (e.g., elongate base member 1702 and sleeve 1704) support assembly, is illustrated. While in certain examples, a pair of brackets and a support rod (e.g., brackets 808*a*, 808*b* and support rod 810 illustrated in FIGS. 8A and 8B) may hold and suspend the elongate base member 1702 and sleeve 1704, in certain other embodiments other support assemblies may be used. For instance, in FIG. 17 a pair of leaf springs 1706*a* and 1706*b* is shown. The elongate base member 1702 and sleeve 1704 are supported by the leaf springs 1706*a* and 1706*b*, which are located proximate the ends of elongate base member 1702. While a pair of leaf springs is illustrated for the purpose of explanation, in certain examples the elongate base member 1702 may be supported by a single leaf spring positioned at one end of the elongate base member 1702. When a force is applied by the user in a generally downward direction on the sleeve 1704, the leaf springs 1706*a*, 1706*b* deflect allowing depression of the sleeve 1704 and elongate base member 1702. As discussed herein, in various examples the downward movement may activate a click trigger, which may be used, for example, to perform a drag and drop operation with the pointing device. In certain examples, tension of each leaf spring 1706*a*, 1706*b* may be adjusted to adjust the downward pressure which activates the click trigger.

Figure 18:
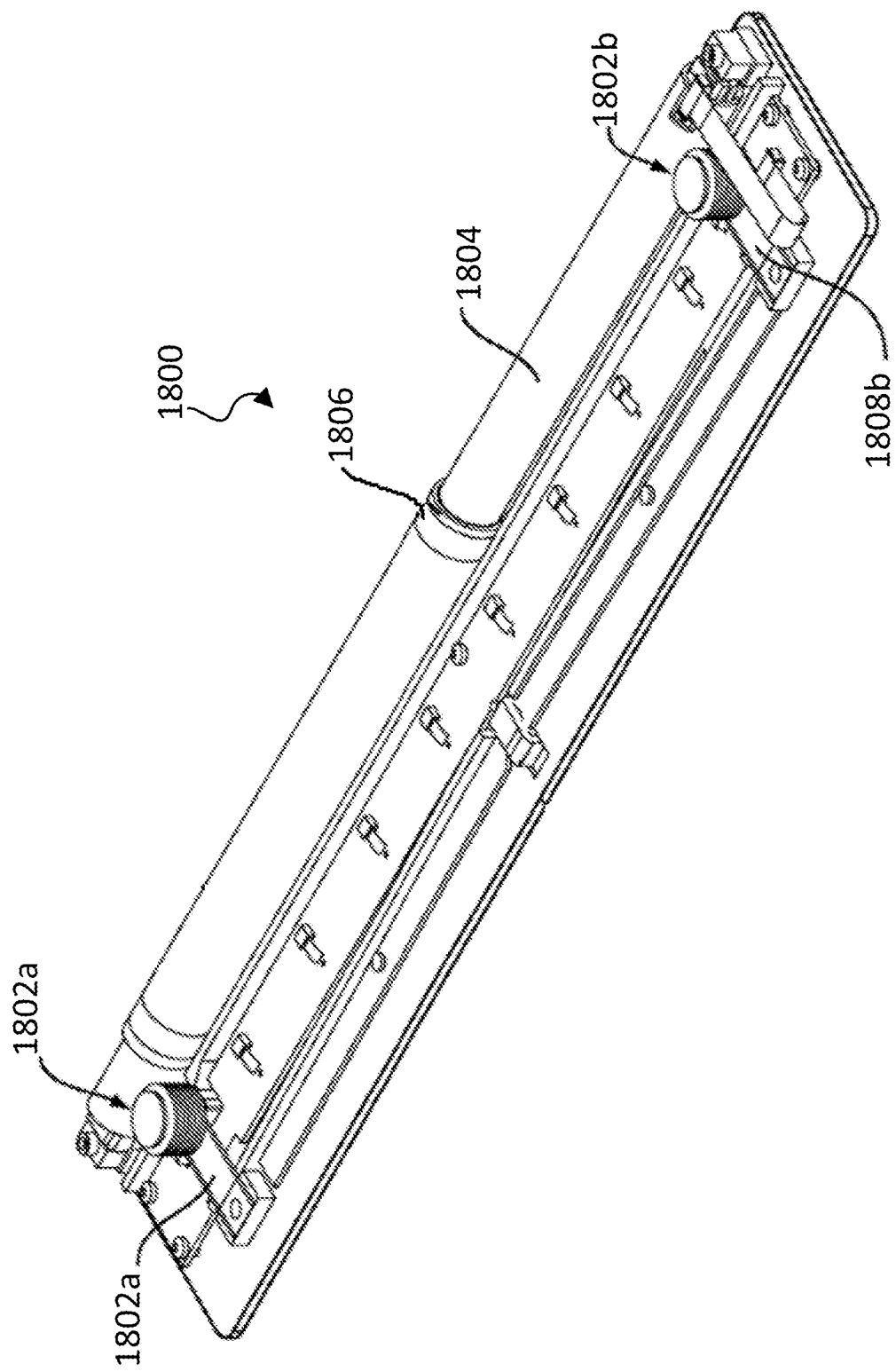
FIG. 18 illustrates a transparent view of another example pointing device system according to aspects of the present disclosure.

Referring now to FIG. 18, one example of a pointing device system 1800 incorporating a support assembly having a pair of solenoids 1802*a*, 1802*b* is shown. Each solenoid 1802*a*, 1802*b* include a respective plunger, coil, and plunger return spring. An elongate base member 1804 and sleeve 1806 are supported by solenoids 1802*a*, 1802*b*, which are located proximate the ends of elongate base member 1804 and are in mechanical communication with leaf springs 1808*a*, 1808*b*. When a force is applied by the user in a generally downward direction on the sleeve 1806, the solenoid plunger(s) deflect, as do leaf springs 1808*a*, 1808*b*, allowing depression of the sleeve 1806.

Figure 19:
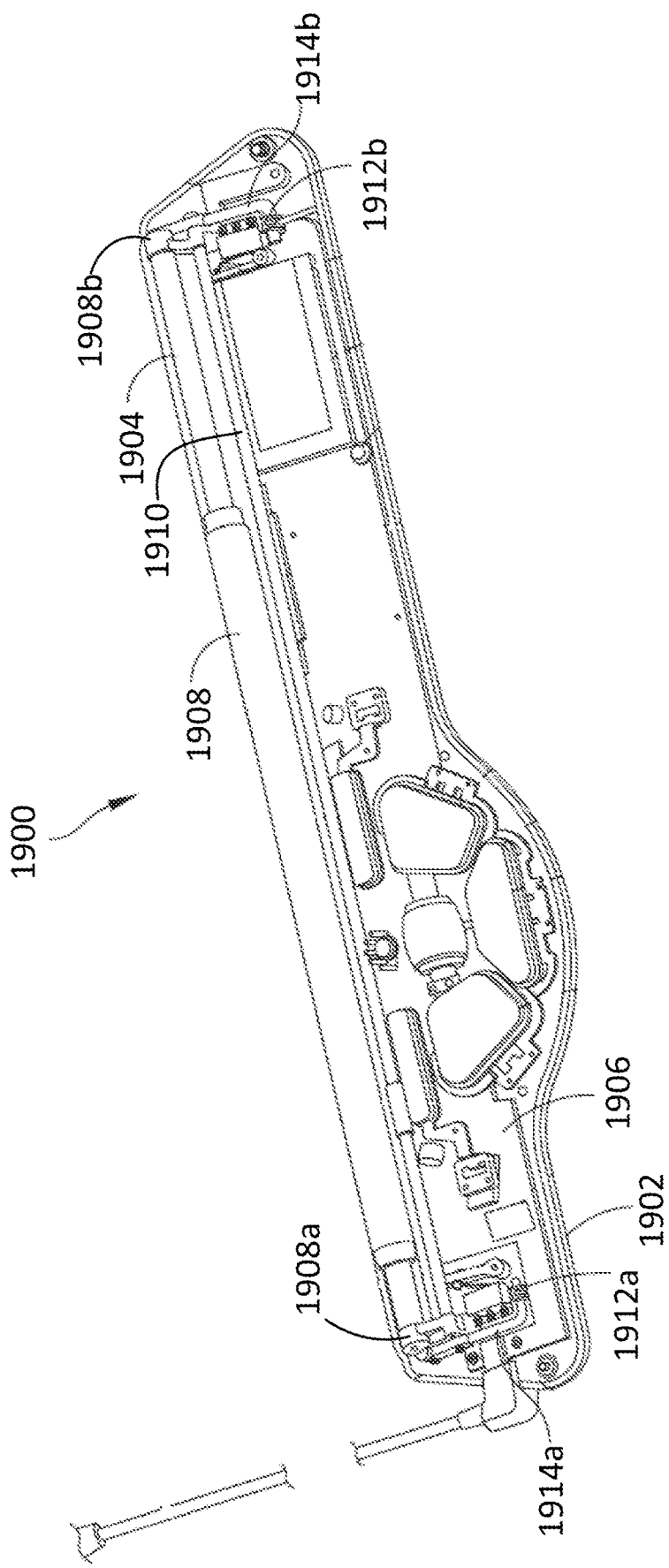
FIG. 19 illustrates a transparent view of a further example of a pointing device system according to aspects of the present invention.

Turning now to FIG. 19, a transparent view of another example of a pointing device system 1900 is illustrated. As shown, the pointing device system 1900 may include many of the same components as the other example pointing device systems described herein (e.g., at least system 100 of FIG. 1, system 700 of FIG. 7, system 800 of FIGS. 8A and 8B, system 1500 of FIG. 15, and system 1600 of FIG. 16). For instance, the pointing device system 1900 may include a device case including a device base 1902, an elongate base member 1904, a circuit board 1906, a sleeve 1908, a sensor, and a click trigger, among other components.

FIG. 19 further shows another example of a support assembly which can be used to hold and suspend the elongate base member 1904 and the sleeve 1906. In particular, FIG. 19 shows a first support 1908*a* and a second support 1908*b* disposed at distal ends of the elongate base member 1904. Each support 1908*a*, 1908*b* is configured to receive the elongate base member 1904, and suspend the elongate base member 1904 and surrounding sleeve 1908 to permit depression thereof. The support system may also include a plurality of support rails 1910 interposed between the first and the second support 1908*a*, 1908*b*. In various examples, the support rails 1910 are disposed substantially adjacent an outer surface of the sleeve 1908. In a further example, the support rails 1910 can include one or more flexible hollow rods.

In various embodiments the device case includes a first pivot 1912*a* connected to the base 1902 of the device case, and a second pivot 1912*b* connected to the base 1902 of the device case. The first pivot 1912*a* may be configured to receive a first angular extension 1914*a* from the first support 1908*a*, and the second pivot 1912*b* may be configured to receive a second angular extension 1914*b* from the second support 1914*b*. Accordingly, the first angular extension 1914*a* and the second angular extension 1914*b* are configured to pivot about the first pivot 1912*a* and second pivot 1912*b*, respectively, in response to a downward pressure being applied to the elongate base member 1904 or sleeve 1906 relative to the base 1902 of the device. In various embodiments, the first and the second pivot 1912*a*, 1912*b* are substantially aligned so as to substantially align rotation of the first angular extension 1914*a* and second angular extension 1912*b* along an axis of rotation. As discussed in further detail herein, such a downward pressure can be used to initiate a click operation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A pointing device system, comprising:
   an elongate base member;
   a sleeve disposed to fit over a portion of the elongate base member, the sleeve configured to rotate about the elongate base member in a first direction and slide about the elongate base member in a second direction substantially orthogonal to the first direction, wherein the sleeve includes a pattern on an inner surface thereof, the pattern including a series of alternating zones; and
   a sensor disposed along a surface of the elongate base member and positioned to detect at least one of a rotational movement of the sleeve relative to the sensor and an axial movement of the sleeve relative to the sensor based at least in part on a variation of the pattern within a field of view of the sensor, and to detect a first zone and a second zone of the series of zones, a detection of the first zone corresponding to a first function to be performed by a processor and a detection of the second zone corresponding to a second function to be performed by the processor, the first function being different than the second function.

2. The pointing device system of claim 1, further comprising a circuit in communication with the sensor that is configured to transmit the detected at least one of the rotational movement and the axial movement of the sleeve.

3. The pointing device system of claim 2, further comprising the processor, wherein the processor is configured to effect motion of a pointer in a visual display relative to the detected at least one of the rotational movement and the axial movement of the sleeve.

4. The pointing device system of claim 3, wherein the series of zones extends along a length of the sleeve in the second direction.

5. The pointing device system of claim 4, wherein the first zone indicates a proximity of the sleeve to a first end of the elongate base member and the second zone indicates a proximity of the sleeve to a second end of the elongate base member.

6. The pointing device system of claim 4, wherein responsive to detection of at least one of the first zone and the second zone the circuit is configured to prompt the processor to perform an end detection operation.

7. The pointing device system of claim 5, wherein the series of zones includes at least a third zone that corresponds to an increase or decrease in a speed of the pointer in the visual display.

8. The pointing device system of claim 1, wherein the pattern includes at least one of a color pattern and a texture pattern.

9. The pointing device system of claim 8, wherein the color pattern includes an alternating pattern of colors extending along a length of the sleeve in the second direction.

10. The pointing device system of claim 1, further comprising:
a click trigger positioned to be activated responsive to an application of a downward pressure to the sleeve or elongate base member, wherein activation of the click trigger generates a click operation; and
a piezoelectric device in communication with the click trigger and configured to generate an audible click responsive to activation of the click trigger.

11. The pointing device system of claim 10, wherein the audible click imitates a noise of a mechanical switch.

12. The pointing device system of claim 11, wherein the piezoelectric device is a piezoelectric buzzer.

13. The pointing device system of claim 1, further comprising:
a first support bracket disposed at a first end of the elongate base member;
a second support bracket disposed at a distal second end of the elongate base member;
a support rod interposed between the first support bracket and the second support bracket, wherein the first support bracket and second support bracket are configured to displace the support rod responsive to the application of downward pressure to the sleeve or elongate base member; and
a flange coupled to the support rod between the first support bracket and the second support bracket and positioned to apply pressure to a click trigger proportional to the downward pressure to the sleeve.

14. The pointing device system of claim 13, further comprising the click trigger, wherein the flange is configured to apply pressure to the click trigger responsive to displacement of the support rod.

15. The pointing device system of claim 14, further comprising a click pressure adjuster including a leaf spring and a sliding fulcrum positioned proximate the click trigger and configured to adjust a downward pressure which activates the click trigger.

16. The pointing device system of claim 15, wherein the leaf spring is interposed between the flange and a case of the pointing device system.

17. The pointing device system of claim 13, wherein the first support bracket is coupled to the first end of the elongate base member at a first end of the first support bracket and coupled to the support rod at a distal second end of the first support bracket, and wherein the second support bracket is coupled to the distal second end of the elongate base member at a first end of the second support bracket and coupled to the support rod at a distal second end of the second support bracket.

18. The pointing device system of claim 13, further comprising a device case including a device base, wherein the first support bracket and the second support bracket are configured to suspend the elongate base member relative to the device base.

19. The pointing device system of claim 1, further comprising:
a click trigger positioned to be activated responsive to an application of downward pressure to the sleeve or the elongate base member, wherein activation of the click trigger generates a click operation; and
a click pressure adjuster including a leaf spring and a sliding fulcrum positioned proximate the click trigger and configured to adjust a downward pressure which activates the click trigger.

20. The pointing device system of claim 19, further comprising a device case including a device base, wherein the leaf spring is coupled the device base at a first end and coupled to the click trigger at a distal second end, the sliding fulcrum being positioned interposed between the device base and the first end and second end of the leaf spring.

21. The pointing device system of claim 19, wherein the sliding fulcrum is configured to translate between the first end and the second end of the leaf spring to adjust the downward pressure which activates the click trigger.

22. A pointing device system, comprising:
an elongate base member;
a sleeve disposed to fit over a portion of the elongate base member, the sleeve configured to rotate about the elongate base member in a first direction and slide about the elongate base member in a second direction substantially orthogonal to the first direction, the sleeve including a pattern on an inner surface thereof, the pattern including a series of alternating zones;
a sensor disposed along a surface of the elongate base member and positioned to detect a first zone and a second zone of the series of zones, a detection of the first zone corresponding to a first function to be performed by a processor and a detection of the second zone corresponding to a second function to be performed by the processor, the first function being different than the second function, and one of the first function and the second function being an end detection operation.

23. The pointing device system of claim 22, further comprising:
a click trigger positioned to be activated responsive to an application of downward pressure to the sleeve or elongate base member, wherein activation of the click trigger generates a click operation;
a piezoelectric device in communication with the click trigger and configured to generate an audible click that imitates a noise of a mechanical switch responsive to activation of the click trigger;
a first support bracket disposed at a first end of the elongate base member;
a second support bracket disposed at a distal second end of the elongate base member;
an elongated support rod interposed between the first support bracket and the second support bracket and that is separate and distinct from the elongate base member, wherein the first support bracket and second support bracket are configured to displace the elongated support rod responsive to the application of downward pressure to the sleeve or elongate base member; and a flange coupled to the elongated support rod between the first support bracket and the second support bracket and positioned to apply pressure to the click trigger proportional to the downward pressure to the sleeve.

24. The pointing device system of claim 23, wherein the piezoelectric device is a piezoelectric buzzer.

25. The pointing device system of claim 23, wherein the flange is configured to apply pressure to the click trigger responsive to displacement of the support rod.

26. The pointing device system of claim 25, further comprising a click pressure adjuster including a leaf spring and a sliding fulcrum positioned proximate the click trigger and configured to adjust a downward pressure which activates the click trigger.

27. The pointing device system of claim 26, wherein the leaf spring is interposed between the flange and a case of the pointing device system.

28. The pointing device system of claim 22, wherein the first support bracket is coupled to the first end of the elongate base member at a first end of the first support bracket and coupled to the support rod at a distal second end of the first support bracket, and wherein the second support bracket is coupled to the distal second end of the elongate base member at a first end of the second support bracket and coupled to the support rod at a distal second end of the second support bracket.

29. The pointing device system of claim 22, further comprising a device case including a device base, wherein the first support bracket and the second support bracket are configured to suspend the elongate base member relative to the device base.

30. The pointing device system of claim 22, further comprising:
a click pressure adjuster including a leaf spring and a sliding fulcrum positioned proximate the click trigger and configured to adjust a downward pressure which activates the click trigger.

31. The pointing device system of claim 30, further comprising a device case including a device base, wherein the leaf spring is coupled the device base at a first end and coupled to the click trigger at a distal second end, the sliding fulcrum being interposed between the device base and the first end and second end of the leaf spring.

32. The pointing device system of claim 31, wherein the sliding fulcrum is configured to translate between the first end and the second end of the leaf spring to adjust the downward pressure which activates the click trigger.

33. The pointing device system of claim 22, wherein the sensor is positioned to detect at least one of rotational movement of the sleeve relative to the sensor and axial movement of the sleeve relative to the sensor based at least in part on a variation of the pattern within a field of view of the sensor.

34. The pointing device system of claim 33, wherein the series of zones extends along a length of the sleeve in the second direction.

35. The pointing device system of claim 34, wherein the first zone indicates a proximity of the sleeve to a first end of the elongate base member and the second zone indicates a proximity of the sleeve to a second end of the elongate base member.

36. The pointing device system of claim 35, further comprising the processor; and a circuit in communication with the sensor that is configured to transmit the detected at least one of the rotational movement and the axial movement of the sleeve, wherein responsive to detection of at least one of the first zone and the second zone, the circuit is configured to prompt the processor to perform an end detection operation.

37. The pointing device system of claim 36, wherein the series of zones includes at least a third zone that corresponds to an increase or decrease in a speed of a pointer in a visual display.

38. The pointing device system of claim 22, wherein the pattern includes at least one of a color pattern and a texture pattern.

39. The pointing device system of claim 38, wherein the color pattern includes an alternating pattern of colors extending along a length of the sleeve in the second direction.

40. A pointing device system, comprising:
an elongate base member;
a sleeve disposed to fit over a portion of the elongate base member, the sleeve configured to rotate about the elongate base member in a first direction and slide about the elongate base member in a second direction substantially orthogonal to the first direction;
a click trigger positioned to activate responsive to an application of downward pressure to the sleeve or elongate base member, wherein activation of the click trigger generates a click operation;
a first support bracket disposed at a first end of the elongate base member;
a second support bracket disposed at a distal second end of the elongate base member;
a support rod interposed between the first support bracket and the second support bracket, wherein the first support bracket and second support bracket are configured to displace the support rod responsive to the application of downward pressure to the sleeve or elongate base member, the first support bracket coupled to the elongate base member at a first end of the first support bracket and coupled to the support rod at a distal second end of the first support bracket, the second support bracket coupled to the elongate base member at a first end of the second support bracket and coupled to the support rod at a distal second end of the second support bracket; and
a flange coupled to the support rod between the first support bracket and the second support bracket and positioned to apply pressure to the click trigger proportional to the downward pressure to the sleeve.

41. The pointing device system of claim 40, wherein the flange is configured to apply pressure to the click trigger responsive to displacement of the support rod.

42. The pointing device system of claim 41, further comprising a click pressure adjuster including a leaf spring and a sliding fulcrum positioned proximate the click trigger and configured to adjust a downward pressure which activates the click trigger.

43. The pointing device system of claim 42, wherein the leaf spring is interposed between the flange and a case of the pointing device system.

44. The pointing device system of claim 40, further comprising a device case including a device base, wherein the first support bracket and the second support bracket are configured to suspend the elongate base member relative to the device base.

45. The pointing device system of claim 40, further comprising a click pressure adjuster including a leaf spring and a sliding fulcrum positioned proximate the click trigger and configured to adjust a downward pressure which activates the click trigger.

46. The pointing device system of claim 45, further comprising a device case including a device base, wherein the leaf spring is coupled the device base at a first end and coupled to the click trigger at a distal second end, the sliding fulcrum being interposed between the device base and the first end and second end of the leaf spring.

47. The pointing device system of claim 46, wherein the sliding fulcrum is configured to translate between the first end and the second end of the leaf spring to adjust the downward pressure which activates the click trigger.

48. The pointing device system of claim 40, further comprising a sensor disposed along a surface of the elongate base member and positioned to detect at least one of rotational movement of the sleeve relative to the sensor and axial movement of the sleeve relative to the sensor based at least in part on a variation of the pattern within a field of view of the sensor.

49. The pointing device system of claim 48, wherein the pattern includes a series of zones extending along a length of the sleeve in the second direction.

50. The pointing device system of claim 49, wherein the series of zones includes at least a first zone that indicates a proximity of the sleeve to a first end of the elongate base member and at least a second zone that indicates a proximity of the sleeve to a second end of the elongate base member.

51. The pointing device system of claim 50, further comprising a processor; and a circuit in communication with the sensor that is configured to transmit the detected at least one of the rotational movement and the axial movement of the sleeve, wherein responsive to detection of at least one of the first zone and the second zone, the circuit is configured to prompt the processor to perform an end detection operation.

52. The pointing device system of claim 50, wherein the series of zones includes at least a third zone that corresponds to an increase or decrease in a speed of a pointer in a visual display.

53. The pointing device system of claim 40, wherein the pattern includes at least one of a color pattern and a texture pattern.

54. The pointing device system of claim 53, wherein the color pattern includes an alternating pattern of colors extending along a length of the sleeve in the second direction.

55. The pointing device system of claim 40, further comprising a piezoelectric device in communication with the click trigger and configured to generate an audible click responsive to activation of the click trigger.

56. The pointing device system of claim 55, wherein the audible click imitates a noise of a mechanical switch.

57. The pointing device system of claim 56, wherein the piezoelectric device is a piezoelectric buzzer.

58. A pointing device system, comprising:
an elongate base member;
a sleeve disposed to fit over a portion of the elongate base member, the sleeve configured to rotate about the elongate base member in a first direction and slide about the elongate base member in a second direction substantially orthogonal to the first direction;
a click trigger positioned to be activated responsive to an application of downward pressure to the sleeve, wherein activation of the click trigger generates a click operation; and
a click pressure adjuster including a leaf spring and a sliding fulcrum positioned proximate the click trigger and configured to adjust a downward pressure which activates the click trigger, the sliding fulcrum configured to translate between the first end and the second end of the leaf spring to adjust the downward pressure which activates the click trigger.

59. The pointing device system of claim 58, further comprising a device case including a device base, wherein the leaf spring is coupled the device base at a first end and coupled to the click trigger at a distal second end, the sliding fulcrum being positioned interposed between the device base and the first end and second end of the leaf spring.

60. The pointing device system of claim 58, further comprising:
a first support bracket disposed at a first end of the elongate base member;
a second support bracket disposed at a distal second end of the elongate base member;
a support rod interposed between the first support bracket and the second support bracket, wherein the first support bracket and second support bracket are configured to displace the support rod responsive to the application of downward pressure to the sleeve or elongate base member; and
a flange coupled to the support rod between the first support bracket and the second support bracket and positioned to apply pressure to the click trigger proportional to the downward pressure to the sleeve.

61. The pointing device system of claim 60, wherein the flange is configured to apply pressure to the click trigger responsive to displacement of the support rod.

62. The pointing device system of claim 61, wherein the leaf spring is interposed between the flange and a case of the pointing device system.

63. The pointing device system of claim 60, wherein the first support bracket is coupled to the elongate base member at a first end of the first support bracket and coupled to the support rod at a distal second end of the first support bracket, and wherein the second support bracket is coupled to the elongate base member at a first end of the second support bracket and coupled to the support rod at a distal second end of the second support bracket.

64. The pointing device system of claim 60, further comprising a device case including a device base, wherein the first support bracket and the second support bracket are configured to suspend the elongate base member relative to the device base.

65. The pointing device system of claim 58, wherein the sleeve disposed to fit over the portion of the elongate base member includes a pattern on an inner surface thereof.

66. The pointing device system of claim 65, further comprising a sensor disposed along a surface of the elongate base member and positioned to detect at least one of rotational movement of the sleeve relative to the sensor and axial movement of the sleeve relative to the sensor based at least in part on a variation of the pattern within a field of view of the sensor.

67. The pointing device system of claim 66, wherein the pattern includes a series of zones extending along a length of the sleeve in the second direction.

68. The pointing device system of claim 67, wherein the series of zones includes at least a first zone that indicates a proximity of the sleeve to a first end of the elongate base member and at least a second zone hat indicates a proximity of the sleeve to a second end of the elongate base member.

69. The pointing device system of claim 68, further comprising a circuit in communication with the sensor that is configured to transmit the detected at least one of the rotational movement and the axial movement of the sleeve, wherein responsive to detection of at least one of the first zone and the second zone the circuit is configured to prompt the processor to perform an end detection operation.

70. The pointing device system of claim 68, wherein the series of zones includes at least a third zone that corresponds to an increase or decrease in a speed of a pointer in a visual display.

71. The pointing device system of claim 67, wherein the pattern includes at least one of a color pattern and a texture pattern.

72. The pointing device system of claim 71, wherein the color pattern includes an alternating pattern of colors extending along a length of the sleeve in the second direction.

73. The pointing device system of claim 58, further comprising a piezoelectric device in communication with the click trigger and configured to generate an audible click responsive to activation of the click trigger.

74. The pointing device system of claim 73, wherein the audible click imitates a noise of a mechanical switch.

75. The pointing device system of claim 74, wherein the piezoelectric device is a piezoelectric buzzer.

\* \* \* \* \*

UNITED STATES PATENT AND TRADEMARK OFFICE
CERTIFICATE OF CORRECTION

| | | |
|---|---|---|
| PATENT NO. | : 11,023,053 B2 | Page 1 of 1 |
| APPLICATION NO. | : 16/348953 | |
| DATED | : June 1, 2021 | |
| INVENTOR(S) | : Steven Wang et al. | |

It is certified that error appears in the above-identified patent and that said Letters Patent is hereby corrected as shown below:

In the Claims

Column 18, Claim 22, Line 38, delete "zones;" and insert -- zones; and --.

Column 22, Claim 68, Line 66, delete "hat" and insert -- that --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*